(12) United States Patent
McCulloch et al.

(10) Patent No.: US 11,112,922 B2
(45) Date of Patent: Sep. 7, 2021

(54) CAPACITIVE TOUCH SENSOR APPARATUS HAVING BRANCHING ELECTRODES

(71) Applicant: 1004335 ONTARIO INC. CARRYING ON BUSINESS AS A D METRO, Ottawa (CA)

(72) Inventors: Robert Donald McCulloch, Ottawa (CA); Guy Michael Amyon Farquharson Duxbury, Ottawa (CA); Albert M. David, Manotick (CA); Gueorgui Pavlov, Ottawa (CA)

(73) Assignee: 1004335 ONTARIO INC. CARRYING ON BUSINESS AS A D METRO, Ottawa (CA)

( * ) Notice: Subject to any disclaimer, the term of this patent is extended or adjusted under 35 U.S.C. 154(b) by 0 days.

(21) Appl. No.: 16/956,442

(22) PCT Filed: Dec. 21, 2018

(86) PCT No.: PCT/CA2018/051644
§ 371 (c)(1),
(2) Date: Jun. 19, 2020

(87) PCT Pub. No.: WO2019/119146
PCT Pub. Date: Jun. 27, 2019

(65) Prior Publication Data
US 2021/0081076 A1 Mar. 18, 2021

Related U.S. Application Data

(60) Provisional application No. 62/609,851, filed on Dec. 22, 2017.

(51) Int. Cl.
*G06F 3/044* (2006.01)
*G06F 3/041* (2006.01)

(52) U.S. Cl.
CPC ........ *G06F 3/0446* (2019.05); *G06F 3/04166* (2019.05); *G06F 3/04164* (2019.05)

(58) Field of Classification Search
CPC .............................. G06F 3/044; G06F 3/0446
See application file for complete search history.

(56) References Cited

U.S. PATENT DOCUMENTS 5,863,821 A * 1/1999 Chao ................. H01L 27/10817
438/253
6,080,632 A * 6/2000 Chao ................. H01L 27/10817
257/E27.089

(Continued)

FOREIGN PATENT DOCUMENTS

| WO | 2013016765 A1 | 2/2013 |
| WO | 2015115307 A1 | 8/2015 |
| WO | WO 2017/219124 A1 | 12/2017 |

OTHER PUBLICATIONS

International Search Report and Written Opinion for PCT/CA2018/051644, dated Mar. 18, 2019 (8 pages).

(Continued)

*Primary Examiner* — Amy Onyekaba
(74) *Attorney, Agent, or Firm* — Bookoff McAndrews, PLLC

(57) ABSTRACT

A capacitive touch sensor comprises a plurality of electrodes on a substrate, and a position of a finger touching the sensor is determined by monitoring output signal changes caused by changes in capacitance caused by the present of the finger over or near the electrodes. The disclosure provides a capacitive touch sensor apparatus comprising a substrate and a plurality of touch sensor electrodes arranged on the substrate. Each of the electrodes comprises a respective primary electrode strip and a respective one or more electrode strip branches extending from the primary electrode strip.

23 Claims, 14 Drawing Sheets

(56) References Cited

U.S. PATENT DOCUMENTS

| | | | | |
|---|---|---|---|---|
| 6,385,430 B1* | 5/2002 | Jackson | G01D 5/342 | 250/208.6 |
| 7,864,503 B2* | 1/2011 | Chang | H03K 17/9622 | 361/288 |
| 8,179,381 B2* | 5/2012 | Frey | G06F 3/0446 | 345/174 |
| 8,217,902 B2* | 7/2012 | Chang | G06F 3/0443 | 345/173 |
| 8,547,118 B1* | 10/2013 | Vojjala | G06F 3/04166 | 324/681 |
| 9,081,457 B2* | 7/2015 | Solven | G06F 3/0446 | |
| 9,141,227 B2* | 9/2015 | Hristov | G06F 3/04164 | |
| 9,146,645 B2* | 9/2015 | Yang | G06F 3/0446 | |
| 9,298,325 B2* | 3/2016 | Shepelev | G06F 3/041662 | |
| 9,658,726 B2* | 5/2017 | Rowe | G06F 3/0443 | |
| 9,829,523 B1* | 11/2017 | Peterson | G06F 3/0443 | |
| 10,042,489 B2* | 8/2018 | Shepelev | G06F 3/0418 | |
| 10,423,285 B2* | 9/2019 | Church | G06F 3/0443 | |
| 10,534,481 B2* | 1/2020 | Badaye | G06F 3/0446 | |
| 10,540,030 B2* | 1/2020 | Kim | H01L 41/1132 | |
| 10,845,902 B2* | 11/2020 | Clark | G06F 3/0443 | |
| 2003/0155842 A1* | 8/2003 | Hobelsberger | H02N 2/163 | 310/331 |
| 2005/0030048 A1* | 2/2005 | Bolender | H01H 13/702 | 324/661 |
| 2006/0072113 A1* | 4/2006 | Ran | G01N 21/55 | 356/445 |
| 2007/0257894 A1* | 11/2007 | Philipp | G06F 3/0443 | 345/173 |
| 2009/0066895 A1* | 3/2009 | Kuo | G02F 1/133371 | 349/114 |
| 2009/0159344 A1* | 6/2009 | Hotelling | G06F 3/047 | 178/18.06 |
| 2009/0194344 A1* | 8/2009 | Harley | G06F 3/0446 | 178/18.06 |
| 2010/0079384 A1* | 4/2010 | Grivna | G06F 3/0443 | 345/173 |
| 2010/0123670 A1* | 5/2010 | Philipp | G06F 3/0446 | 345/173 |
| 2010/0156810 A1* | 6/2010 | Barbier | G06F 3/0446 | 345/173 |
| 2010/0302201 A1* | 12/2010 | Ritter | G06F 3/0446 | 345/174 |
| 2011/0025639 A1* | 2/2011 | Trend | G06F 3/0445 | 345/174 |
| 2011/0132642 A1* | 6/2011 | Shinoda | H05K 1/028 | 174/254 |
| 2012/0062472 A1* | 3/2012 | Yilmaz | G06F 3/041 | 345/173 |
| 2012/0162099 A1* | 6/2012 | Yoo | G06F 3/0445 | 345/173 |
| 2012/0169401 A1* | 7/2012 | Hristov | G06F 3/04164 | 327/517 |
| 2012/0287068 A1* | 11/2012 | Colgate | G06F 3/046 | 345/173 |
| 2013/0033450 A1* | 2/2013 | Coulson | G06F 3/041 | 345/174 |
| 2013/0207911 A1 | 8/2013 | Barton et al. | | |
| 2013/0277091 A1* | 10/2013 | Chang | H05K 1/0296 | 174/250 |
| 2014/0022202 A1* | 1/2014 | Badaye | G06F 3/0448 | 345/174 |
| 2014/0078068 A1* | 3/2014 | Jones | G06F 3/0445 | 345/173 |
| 2014/0092056 A1* | 4/2014 | Jhou | G06F 3/0446 | 345/174 |
| 2014/0146013 A1* | 5/2014 | Noguchi | G02F 1/13338 | 345/174 |
| 2014/0152621 A1 | 6/2014 | Okayama et al. | | |
| 2014/0168147 A1* | 6/2014 | Huang | G06F 3/0448 | 345/174 |
| 2014/0232681 A1* | 8/2014 | Yeh | G06F 3/044 | 345/174 |
| 2014/0296808 A1* | 10/2014 | Curran | G01N 27/225 | 604/361 |
| 2014/0300833 A1* | 10/2014 | Yang | G06F 3/0446 | 349/12 |
| 2014/0313169 A1* | 10/2014 | Kravets | G01R 27/2605 | 345/178 |
| 2014/0347299 A1* | 11/2014 | Lu | G06F 3/0446 | 345/173 |
| 2015/0008941 A1* | 1/2015 | Weng | G06F 3/04164 | 324/658 |
| 2015/0028894 A1* | 1/2015 | Sleeman | G06F 3/0446 | 324/662 |
| 2015/0041302 A1 | 2/2015 | Okumura et al. | | |
| 2015/0241924 A1* | 8/2015 | Chang | G06F 3/0446 | 349/12 |
| 2016/0018940 A1* | 1/2016 | Lo | G06F 3/0446 | 345/174 |
| 2017/0075456 A1* | 3/2017 | Lai | G06F 3/0412 | |
| 2017/0123546 A1* | 5/2017 | Zhan | G06F 3/0412 | |
| 2018/0138889 A1 | 5/2018 | Rinaldi et al. | | |
| 2018/0185630 A1* | 7/2018 | Fenton | A61N 1/0452 | |
| 2018/0188881 A1 | 7/2018 | Kyoung et al. | | |
| 2018/0211904 A1* | 7/2018 | Cho | H01L 23/49562 | |
| 2018/0224965 A1* | 8/2018 | Church | G06F 3/0443 | |
| 2018/0224966 A1* | 8/2018 | Church | G06F 3/0412 | |
| 2018/0224968 A1* | 8/2018 | Church | G06F 3/0446 | |
| 2018/0314386 A1* | 11/2018 | Tsai | G06F 3/0418 | |
| 2019/0087033 A1* | 3/2019 | Son | G06F 3/044 | |
| 2020/0310596 A1* | 10/2020 | Glad | G06F 3/0445 | |

OTHER PUBLICATIONS

International Search Report and Written Opinion in corresponding Application No. PCT/CA2018/051644, dated Apr. 8, 2019, (9 pages).

International Search Report and Written Opinion in corresponding Application No. PCT/CA2018/051645, dated Mar. 11, 2019, (8 pages).

Wang et al. "Multi-Channel Capacitive Sensor Arrays" Sensors; 16, 150, pp. 1-12, Jan. 25, 2016, (12 pages).

Walker, "Fundamentals of Projected-Capacitive Touch Technology", Jun. 1, 2014, (196 pages).

\* cited by examiner

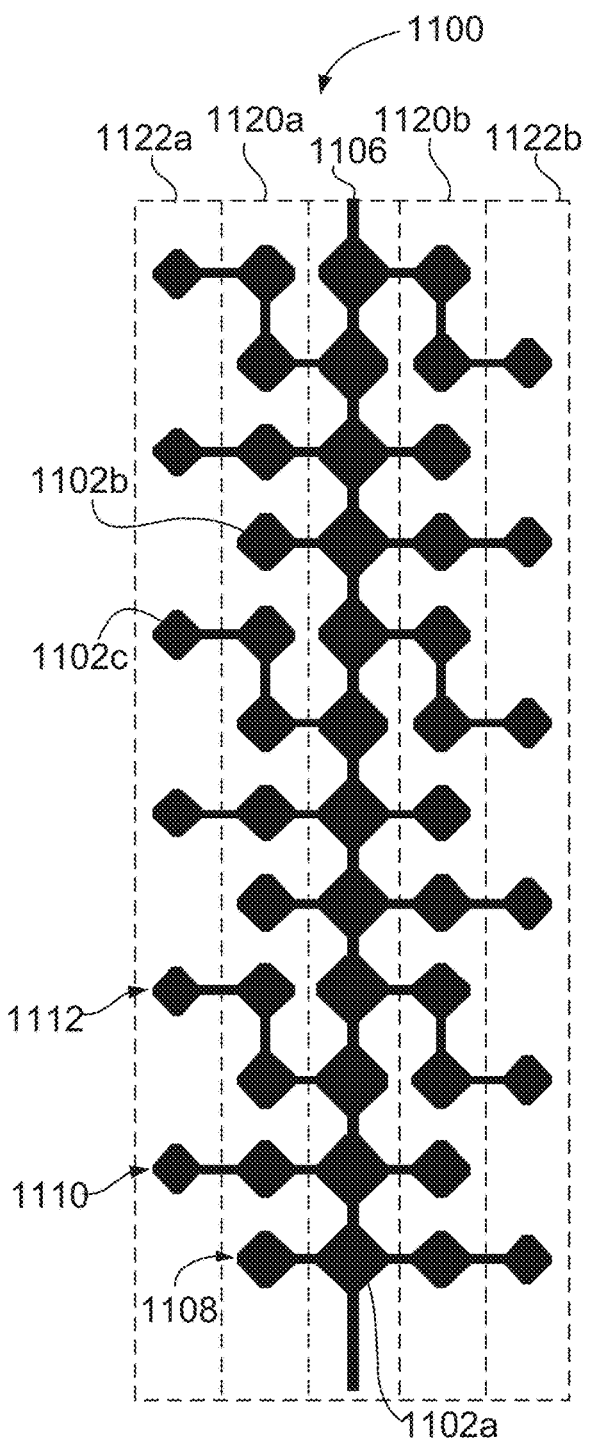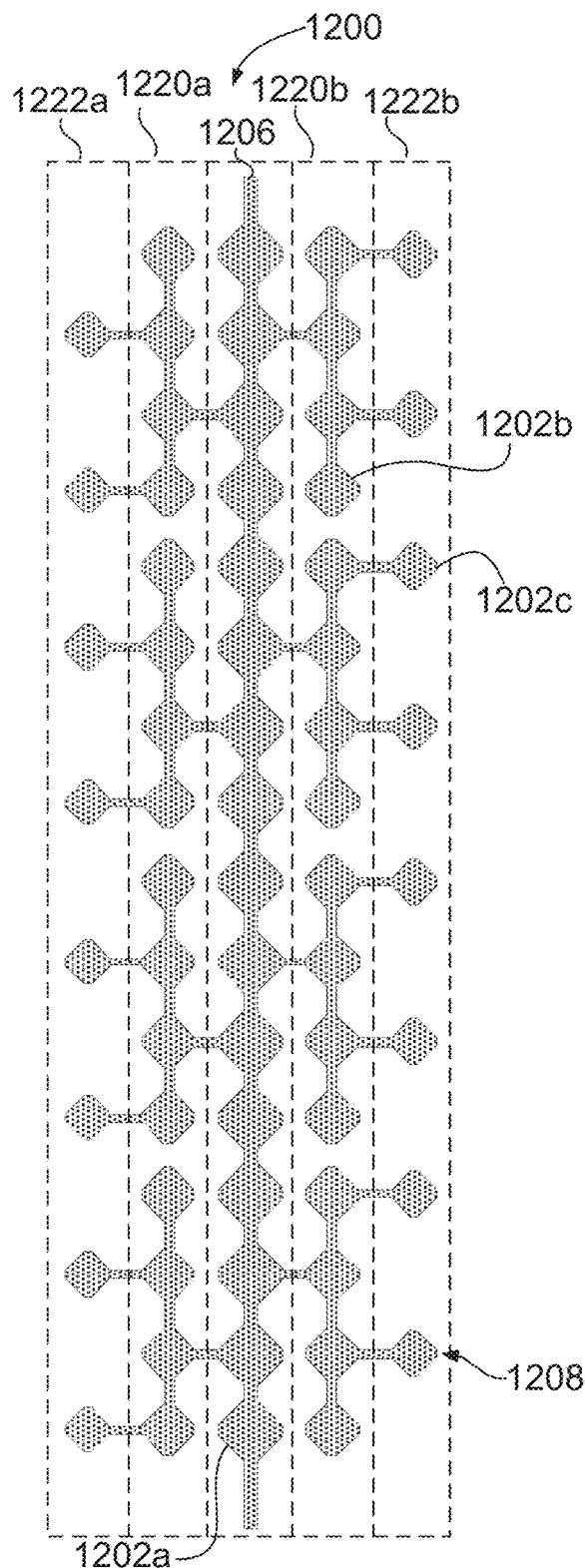
FIG. 11
FIG. 12

CAPACITIVE TOUCH SENSOR APPARATUS HAVING BRANCHING ELECTRODES

RELATED APPLICATION(S)

This application is the U.S. National Phase entry under 35 U.S.C. § 371 of International Application No. PCT/CA2018/051644, filed Dec. 21, 2018, which claims priority to U.S. Provisional Patent Application Ser. No. 62/609,851, filed Dec. 22, 2017.

FIELD OF THE DISCLOSURE

The present disclosure relates generally to capacitive touch sensing technology, and more particularly to capacitive touch sensors comprising at least one plurality of electrodes.

BACKGROUND

A capacitive touch sensor (e.g. for a touchscreen) typically comprises a two-dimensional criss-cross array of substantially transparent conductive electrodes arranged on a substrate layer. Each electrode typically runs from one edge of the screen to the opposite side, and are frequently made of indium-tin-oxide (ITO). The electrodes may be in the form of strips. Each strip may be a simple straight, narrow track or a series of interconnected pads (e.g. diamond-shaped pads) that together form a track in a given axial direction. A protective top layer of glass or plastic will typically cover the substrate layer and the conductive strips.

An electronic signal with frequency content (e.g. in the 500 kHz to 30 MHz) range may be input to the electrodes (either collectively or individually) and the effect of the electrodes impedance on that signal is monitored. When a human finger (or another member with a some electrically conductive material) is applied over one or more of the electrodes, a change in capacitance is caused, and this change in capacitance is detectable and measureable. Thus, by monitoring the output from each electrode, it can be determined where the sensor was touched. For two-dimensional sensing, two overlapping sets of electrodes in perpendicular directions may be monitored, thereby allowing for determination of the position of the touch in two dimensions.

Conventional capacitive touch sensors may use self-capacitance or mutual capacitance configurations. The capacitance of a single electrode to ground is commonly referred to as its self-capacitance. In self-capacitance touch sensors, the capacitance of each electrode with respect to ground is detected separately. By sensing which electrodes have an increased self-capacitance, the location of a finger touch can be determined.

In mutual capacitance touch sensors, the mutual capacitances between perpendicular pairs of electrodes is detected. For example, in a grid of vertical and horizontal (X and Y) electrodes, the mutual capacitances between the perpendicular pairs of X and Y electrodes are monitored. In a typical two-dimensional electrode grid, each X electrode is arranged to have a region in close proximity with each Y electrode (thus creating a mutual capacitance between each X-Y electrode pair. By sensing which X electrodes couple to which Y electrodes, the location of one or more finger touches can be determined in two dimensions.

A typical interconnected-diamond-pad patterned touch screen has a self-capacitance and mutual-capacitance change rapidly in some areas and minimal capacitance change in other areas as a finger is traversed across the electrode. This "unevenness" may make resolving the fingers position to an accuracy much finer than the spacing between two parallel electrodes difficult and/or unreliable. However, making the electrode pattern finer may not improve overall function as doing so may reduce the desired capacitance changes while increasing undesired fixed capacitances such as crossover capacitance and crosstalk capacitance between multiple electrode traces around the periphery of the sensor area. Reducing the size and spacing of the electrodes may also greatly increase the amount of sensing channels required for a given sensor area and may slow down sensing speeds due to the higher number of electrodes to be driven and sensed.

SUMMARY

According to one aspect, there is provided a capacitive touch sensor apparatus comprising: a substrate; a plurality of touch sensor electrodes arranged on the substrate, wherein each said electrode comprises: a respective primary electrode strip; and a respective one or more electrode strip branches extending from the primary electrode strip.

According to another aspect, there is provided a capacitive touch sensor system comprising: a touch sensor controller; a capacitive touch sensor apparatus operatively coupled to the controller, the capacitive touch sensor apparatus comprising a substrate; a plurality of touch sensor electrodes arranged on the substrate, wherein each said electrode comprises: a respective primary electrode strip; and a respective one or more electrode strip branches extending from the primary electrode strip.

According to another aspect, there is provided an electrode array for a capacitive touch sensor, comprising: a plurality of touch sensor electrodes, wherein each said electrode comprises: a respective first order electrode branch; and one or more respective higher order electrode branches, the one or more respective higher order electrode branches comprising one or more secondary electrode branches extending from the first order electrode branch.

In some embodiments, each of the one or more electrode strip branches comprises a respective first order branch portion extending from the corresponding primary electrode strip.

In some embodiments, for each said electrode, the respective first order branch portion is substantially orthogonal to the respective primary electrode strip.

In some embodiments, each of the one or more electrode strip branches further comprises one or more second order branch portions extending from the first order branch portion.

In some embodiments, each of the one or more electrode strip branches further comprises one or more third order branch portions extending from at least one of the one or more second order electrode branch portions.

In some embodiments, for each said electrode, the respective one or more electrode strip branches of the electrode are interleaved with the one or more electrode strip branches of at least one other of the plurality of electrodes.

In some embodiments, the plurality of touch sensor electrodes comprises first and second sets of electrodes, the primary electrode strips of the first set of electrodes being substantially parallel to each other, and the primary electrode strips of the second set of electrodes being substantially parallel to each other and substantially orthogonal to the primary electrode strips of the first set of electrodes.

In some embodiments, for each of the first set of electrodes, the respective primary electrode strip and the respective one or more electrode strip branches define a first pattern, and for each of the second set of electrodes, the respective primary electrode strip and the respective one or more electrode strip branches define a second pattern.

In some embodiments, the electrode strip branches of the plurality of electrodes do not crossover each other.

In some embodiments, each said electrode comprises a plurality of interconnected pads.

In some embodiments, the pads have variable sizes.

In some embodiments, for each said electrode, the size of each of the pads of the electrode is a function of a position of the pad relative to the primary electrode strip of the electrode.

In some embodiments, the pads of the electrode strip branches are smaller than the pads of the primary electrode strip.

In some embodiments, a number of pads of the plurality of electrodes is at least four times a number of electrode crossovers.

Other aspects and features of the present disclosure will become apparent, to those ordinarily skilled in the art, upon review of the following description of the specific embodiments of the disclosure.

BRIEF DESCRIPTION OF THE DRAWINGS

The present disclosure will be better understood having regard to the drawings in which:

FIG. 11 is a layout view of another example electrode according to some embodiments;

FIG. 12 is a layout of another example electrode according to some embodiments;

DETAILED DESCRIPTION

Figure 1:
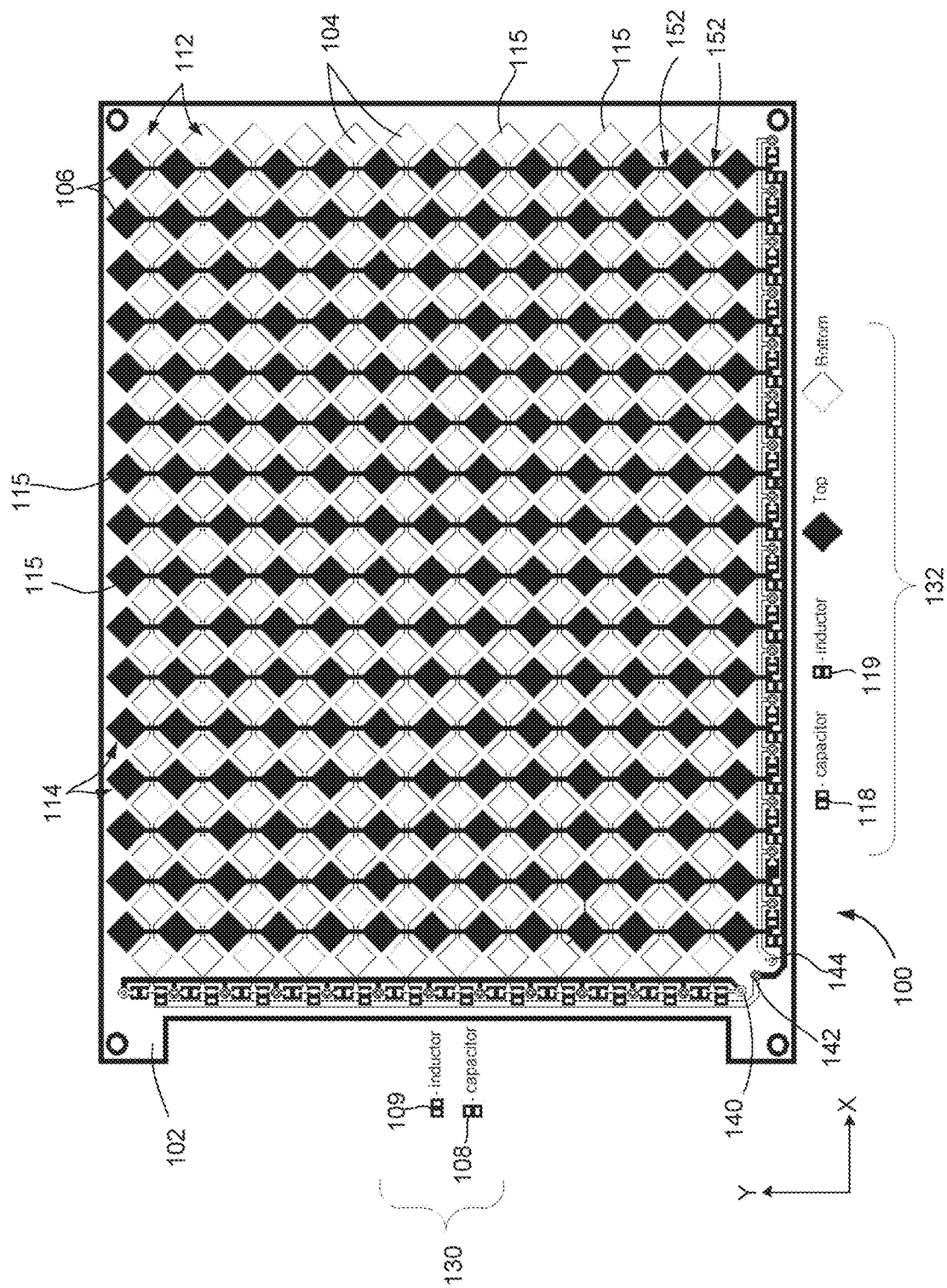
FIG. 1 is a top plan view of an example capacitive touch sensor panel.

The present disclosure provides a capacitive touch sensing apparatus and method, which may be used for touch sensor panels (e.g. a touchscreen) that may be engaged with a finger or fingers, or any other conductive object such as a stylus. The touch sensor may implement one-dimensional or two-dimensional sensing.

While the embodiments shown in the figures and described below are capacitive touch sensors that may operate in the 0.5 to 30 MHz range, aspects of the disclosure may also be implemented in touch sensors using other signal frequencies.

Embodiments are not limited to ITO for electrodes, and other conductive materials may be used. Such conductive materials may be transparent, translucent, or opaque. Opaque electrodes may be very fine in some embodiments such that they are less noticeable to the eye. Electrodes may be deposited or printed using a chemical process, or otherwise be printed onto the substrate layer. Typical ITO strips may have a resistance of approximately 100 Ohms/square. A relatively low resistance of the electrode strips may be preferable to reduce diminishment of the electronic tone signals. Electrodes formed by a fine metal mesh may provide a lower resistance than conventional ITO strips, and may, therefore, be more suitable for larger touch panels. Embodiments are not limited to any particular type of electrode. The shape of the electrodes may also vary and electrodes are not necessarily simple straight (uniform width) strips. For example, some embodiments may include electrodes in one or more other shapes such as rectangles or circles. The term "strip" as used herein includes both straight paths or tracks with a uniform width, and paths or tracks with non-uniform widths. For example, an electrode "strip" may comprise a series of interconnected pads (e.g. diamond shaped pads).

In the following description, two generally orthogonal sets of electrodes may be referred to as "vertical" and "horizontal" electrodes, or alternatively as "X" and "Y" electrodes because they are used to determine position along the X-axis and Y-axis axis respectively. However, it is to be understood that the terms "vertical" and "horizontal" (or "X" and "Y") are used simply for ease of description and illustrative purposes, and embodiments are not limited to a particular orientation of the electrodes or a touch sensor device.

The touch sensor apparatus may include a touch sensor panel and may further include a controller connected to the panel. In some embodiments, the capacitive touch sensor apparatus is a touch screen that includes display capabilities in addition to touch sensor capabilities. A capacitive touch screen may be a 'self-capacitance' type of projected capacitive (PCAP) touch screen and display (although the circuitry and methods described herein apply equally to touch pads that do not also act as screens or displays). A self-capacitance type of touch sensor apparatus, typically comprises a set of row electrodes (channels) and a set of column electrodes (channels) distributed on a panel substrate. Each electrode is sensed individually for a signal resulting from capacitance coupling with a finger or other object touching or near the part of the screen that it helps identify. The signals from at least one X electrode and at least one Y electrode (but usually more of each) is interpreted to declare a location of one or more contacts on the touch area. Each X and Y electrode is nominally an independent sensor electrode.

A common type of PCAP touch screen is known as 'mutual-capacitance' type. Again, there are X and Y sensor electrodes, but, normally, the electrodes in one axis (e.g. X-axis) are driven in turn, and signals from the other set of electrodes (e.g. Y-axis) are all sampled at a faster rate so that they can all be sampled each step an individual transmitting electrode is driven. Using this scheme, each signal is already the result of a known row/column pair. This may allow management of more touches with less ambiguity. Also, each touch location is normally calculated from signal levels received from multiple nearby X/Y electrode combinations.

In some embodiments, a capacitive touch panel apparatus has a touch area that consists of X electrodes and Y electrodes (though any two sets of electrodes each covering the touch area in some other geometry such as criss-cross may also be utilized). Sets of electrodes may be easier to interpret if they are orthogonal, but embodiments are not limited to orthogonal sets of electrodes.

The touch sensor of the capacitive touch panel apparatus, in some embodiments, has two sets of generally strip-shaped electrodes for capacitive sensing. Each individual sensing electrode is excited and sensed in turn to measure its response in the form of a signal that relates to the extent of capacitive coupling the electrode experiences. Capacitive coupling may be due to a nearby or touching finger or object. There are varying degrees of closeness/coupling that result from variations in contact overlap area, contact firmness, properties of the object/finger and other factors.

Each of the two sets of electrodes (e.g. X and Y electrodes) may extend over the entire touch sensing area so that signals from one or more electrodes from each set are obtained when there is a touch of (or close approach to) the touch area.

FIG. 1 is a top view of a layout for an example capacitive touch sensor apparatus 100 (which is in the form of a touch sensor panel). The apparatus 100 may be connected to or further include a controller (such as the controller 200 of FIG. 2 or the controller 1700 of FIG. 17) connected to the apparatus 100. The capacitive touch apparatus 100 includes conductor elements discussed below printed, deposited or etched on a substrate 102. The substrate 102 may, for example, be a Printed Circuit Board (PCB) substrate material including a top PCB layer and a bottom PCB layer (not shown) that underlays the top PCB layer. However, the other substrate materials (such as transparent materials including glass or plastic) may be used as well. In some embodiments, the layers of the substrate may comprise different materials.

The capacitive touch sensor apparatus 100 in this embodiment includes horizontal (Y) electrodes 104 and vertical (X) electrodes 106 arranged on the substrate 102. The Y electrodes 104 are electrically separated (insulated) from the X electrodes 106. For example, an insulating layer may be positioned between electrodes and/or areas of the electrodes that overlap. The Y electrodes 104 may be arranged on a bottom surface of the top PCB layer of the substrate 102, and the X electrodes 106 may be arranged on a top surface of the bottom PCB layer of the substrate 102, with an insulating layer therebetween. The insulating layer is provided between the Y and X electrodes 104 and 106. The insulating layer may be any suitable material that electrically insulates the electrodes. In other embodiments, a single substrate layer (e.g. PCB or a transparent substrate) may be used with Y channels on one face of the substrate layer, and Y channels on the opposite face. Embodiments are not limited to any particular arrangement of multiple layers of channels and/or substrate layers.

The Y electrodes 104 are shown in white with a black outline, while the X electrodes 106 are shown solid black in FIG. 1. This visual differentiation does not imply that the Y electrodes 104 are made of a different material than the X electrodes 106. Rather, the visual differentiation is simply to help visually distinguish the X electrodes from the Y electrodes. The Y electrodes 104 and the X electrodes 106 may comprise the same material. For example, the electrodes 104/106 may comprise a metal conductor, such as, but not limited to, copper. In other embodiments, the electrodes may be made of a substantially transparent conductor such as, but not limited to, ITO or metal mesh.

The touch sensor apparatus 100 in this example is a single plane pattern, meaning that the electrodes are arranged in substantially the same plane (with only a small separation).

Each of the Y electrodes 104 in this example embodiment are connected to a respective capacitor 108 and a respective inductor 109 to form a respective resonance circuit. Each of the X electrodes 106 in this example embodiment are connected to a respective capacitor 118 and a respective inductor 119 to form a respective resonance circuit. The resonance circuits including the Y electrodes 104 may be referred to as Y (horizontal) "channels" 112, and the resonance circuits including the X electrodes 106 may be referred to as X "channels" 114. Each channel 112/114 is connected to a controller (not shown) that inputs electronic tone signals to the channels (including the Y electrodes 104 and X electrodes 106) and receives outputs from the channels. The controller processes the outputs to detect touch events. More particularly, the processor detects changes in the outputs from one or more channels 112/114. The change in output is due to a change in the resonance frequency of the one or more channels 112/114 caused by the capacitance change caused by a finger or other object touching the apparatus 100.

The capacitors 108 connected to the Y electrodes 104 are each indicated by the respective vertically arranged capacitor icon 108 shown in first legend section 130 of FIG. 1. The inductors 109 connected to the Y electrodes 104 are each indicated by the respective horizontally arranged inductor icon 109 shown in the first legend section 130. The capacitors 118 connected to the X electrodes 106 are each indicated by the respective horizontally arranged capacitor icon 118 shown in second legend section 132 of FIG. 1. The inductors 119 connected to the X electrodes 106 are each indicated by the respective vertically arranged inductor icon 119 shown in the second legend section 132.

The Y channels 112 (including Y electrodes 104) are collectively connected to a first input/output connection 140 and are collectively connected to ground 142 (with the corresponding capacitor 108 and inductor 109 connected in series between the first input/output connection 140 and ground 142). The X channels 114 (including X electrodes 106) are collectively connected to a second input/output connection 144 and are also collectively connected to ground 142 (with the corresponding capacitor 118 and inductor 119 connected in series between the second input/output connection 144 and ground 142).

In this example, the capacitive touch apparatus 100 is configured for frequency multiplexing, whereby each Y channel 112 has a unique resonance frequency (among the Y channels 112) and each X channel 114 has a unique resonance frequency (among the X channels 114). Thus, to scan the Y channels 112, a series of input signals are input collectively to all Y electrodes 104 cycling through the resonant frequencies of the Y channels 112. In frequency multiplexing, each channel in a set of channels has a unique frequency. A channel excited by a frequency not matching its resonance frequency band is unaffected by the signal and yields no response related to a touch/contact. This way, the set of channels can be connected using the same wires yet addressed/queried one at a time by selecting the frequency of the input signals, and only touch information from the currently queried channel is sampled. In FIG. 1, the Y channels 112 are one set of channels (sharing input/output connection 140) and the X channels 114 are another set of channels (sharing input/output connection 144).

The controller processes the output for the cycling frequencies to detect changes caused by a touch event. Similar cycling input signals at the resonant frequencies of the X channels 114 are input to the X channels. The controller may include a tunable electronic tone signal generator to generate the series of input signals for the Y and X channels 112/114. Frequency multiplexing in this manner allows multiple channels to be connected to a single input/output connection, thereby reducing the number of connections required between the controller and the apparatus 100. However, embodiments are not limited to frequency multiplexing touch panels. Aspects of the disclosure described herein may be applied in other configurations as well. For example, rather than frequency multiplexing, a capacitive touch screen may comprise channels that are individually connected to the controller to be selectively driven (at the same frequency or with pulse trains used by conventional projected capacitive (PCAP) touch screens).

Examples of frequency multiplexing touchscreen configurations are disclosed in International Patent Cooperation Treaty (PCT) Patent Application Publication No. WO 2017/219124, the entire content of which is incorporated herein by reference.

The capacitors 108 and 118 and inductors 109 and 119 may all be located on a top surface of the substrate 102 and connected through the substrate 102 and the bottom PCB layer (not shown) to the electrodes 104 and 106, respective first and second input/output connections 140 and 144 and ground 142 as needed. Other arrangements are also possible. Any suitable arrangement connecting circuit elements together into the layout shown in FIG. 1 may be used.

A touch event on the capacitive touch sensor apparatus 100 may register a change in capacitance for at least one Y electrode 104 and at least one X electrode 106, thereby enabling a determination of a position of the touch event in two dimensions.

As shown in FIG. 1, each of the Y and X electrodes 104 and 106 are in the form of elongated electrode strips formed by several spaced apart and interconnected diamond shaped pads 115. These pads 115 do not overlap. Rather, Y electrodes 104 overlap or crossover (but do not make contact with) the X electrodes 106 at narrow portions 152 of the electrodes 104 and 106 between adjacent pads 115. Interconnected pads that form an electrode strip are not limited to diamond shaped pads. Other shapes (e.g. circular) may be used. The electrodes of capacitive touch sensors may be designed to be as narrow as possible at crossovers to minimize the mutual X/Y capacitance they form. This minimization is to limit the total capacitance from many crossovers to limit how much it 'dilutes' the small capacitance changes due to touches that are being measured and allow more accurate touch measurements to be possible. Each pad 115 in FIG. 1 may, for example, have a width (along the X-axis) approximately in the range of approximately 4 mm to approximately 8 mm and an approximately equal height (in the Y-axis), although embodiments are not limited to this size range.

The electrodes 104 and 106 are not directly connected to a ground plane, and the capacitors 108 and 118 and inductors 109 and 119 do not overlap on the ground plane. Therefore, the electrodes 104 and 106 will "float" (in an electrical voltage sense) over the substrate 102. The Y and X electrodes 104 and 106 are connected to a physical ground via ground connection 142. The touch of a finger provides a virtual ground through the body. Thus, when a human finger is applied to the touch sensor apparatus 100, the measured amplitude response will increase due to the change in capacitance, despite the absence of the ground plane. In an experimental setting, the layout described above provided a response amplitude change of 5 to 6 percent from a touch event.

Figure 2:
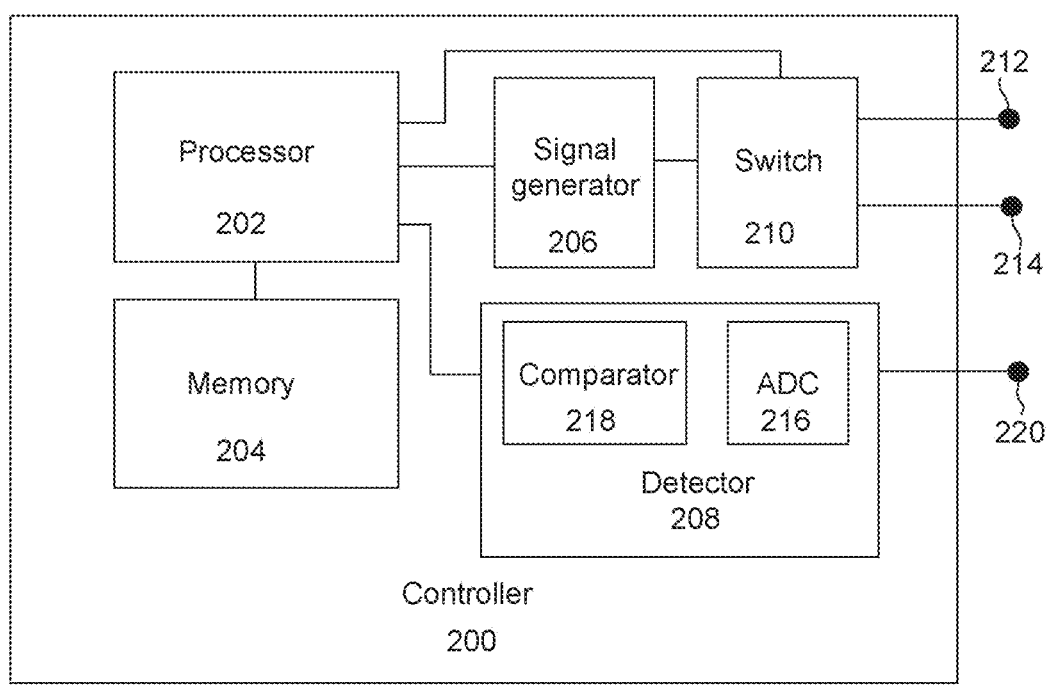
FIG. 2 is a block diagram of a controller according to some embodiments.

By way of non-limiting example, FIG. 2 is a block diagram of a controller 200 that may be connected to control the touch sensor apparatus 100 shown in FIG. 1. The controller 200 includes control circuitry comprising a processor 202 and a memory 204. As mentioned above, other control circuitry arrangements may also be used. The controller 200 further comprises a tuneable electronic tone signal generator 206, a detector 208 and a switch 210. The memory 204 stores computer-executable code thereon for causing the processor 202 to perform functions described below. In other embodiments, the memory 204 may be incorporated as part of the processor 202, rather than external to the processor 202 as shown in FIG. 2. The processor 202 is also connected to communicate with the tuneable electronic tone signal generator 206, the detector 208, and the switch 210. The communication may include providing control signals to the tuneable electronic tone signal generator 206, the detector 208 and the switch 210, as well as receiving, as input, data output from the detector 208.

A first output terminal 212 of the controller 200 may be connected to the first input/output connection 140 for Y channels 112 of the touch sensor apparatus 100 of FIG. 1 to excite the Y channels 112. A second output terminal 214 of the controller 200 may be connected to the second input/output connection 144 for X channels 114 of the touch sensor apparatus 100 of FIG. 1 to excite the X channels 114.

Electronic tone signals generated by the tuneable electronic tone signal generator 206 are selectively output through the switch 210 to either a first output terminal 212 or a second output terminal 214 as directed by the processor 202. The tuneable electronic tone signal generator 206 in this example is capable of selectively generating signals (for input to the touch sensor apparatus 100) at (or near) each of the resonant frequencies of the Y and X channels 112 and 114 (shown in FIG. 1). The processor 202 controls the switch 210 and the tuneable electronic tone signal generator 206 to scan each of the Y and X channels 112 and 114. For example, the switch 210 may first be set to direct the electronic tone signals to the first output terminal 212 while the tuneable electronic tone signal generator 206 cycles through all of the resonance frequencies for the Y channels 112. Then the switch 210 may be set to direct the electronic tone signals to the second output terminal 214, while the tuneable electronic tone signal generator 206 cycles through all of the resonance frequencies for the X channels 114. Other scanning sequences may also be used (including hopping sequences).

The detector 208 in this example includes an ADC 216 and a comparator 218. The detector 208 is connected to controller input terminal 220 to receive, as input, the response output from the touch sensor apparatus 100 (shown in FIG. 1). The controller input terminal 220 may also be connected to the first and second output connections 140 and 144 of the touch sensor apparatus 100 to measure the response of the Y and X channels 112 and 114 (shown in FIG. 1). The detector 208 receives analog output from the touch sensor apparatus 100 and first converts the analog signal to digital values using the ADC 216. The digital values are compared to expected response levels (e.g. expected response for no touch event) by the comparator 218. The comparison data from the comparator 218 is passed to the processor 202. Based on the output from the detector 208, the current state of the switch 210 and the current selected resonance frequency, the processor determines which of the Y channels 112 and which of the X channels 114 (shown in FIG. 1) is currently touched.

The tuneable electronic tone signal generator 206 may include a synthesizer chip or circuit. The switch 210 of the controller 200 may include a PIN diode (not shown) that can divert the electronic tone signal from the tuneable electronic tone signal generator 206 to the first or second output terminals 212 and 214. The processor 202 (or possibly the switch 210) may include a switch driver control circuit that controls the PIN diode. The switch driver control circuit may turn the PIN diode on and off, for example, by applying a forward or reverse bias. The switch driver control circuit may use a low-pass filter between the electronic tone signal generator and the switch.

A controller of the capacitive touch circuits described herein may include functionality for programming or configuring the controller. Such software may provide a graphical interface on a PC. Such software may be created with Borland visual C++ Builder, for example. The software may include various functions and components including, but not limited to: a block of library; the description of variables; the USB block of the Open Communication Port; the ADC block of the Read File; the block of decision of the solution; the visual block that created the graphic interface. The graphic interface may show an image that represents the area covered by channels. The graphic interface may also include controls such as a "start button", selecting service information, and may display a graphical indicator in the displayed area to represent a detected touch. If multiple touches are detected, two or more graphical indicators to represent the touches may be shown. The touches will be detected at different times due to the sequential scanning. However, the speed of change of the applied electronic tone signal for the scanning is very high, and the touch sensor panel indicators appears as simultaneous single or multi-touch.

The controller for a touch sensor (such as the controller 200 shown in FIG. 2) may be provided separately from the touch sensor panel. Since only a single input and single output may be required for various sizes, a single controller may be configured to work with touch sensor panels of various sizes and sensor resolutions.

Figure 3:
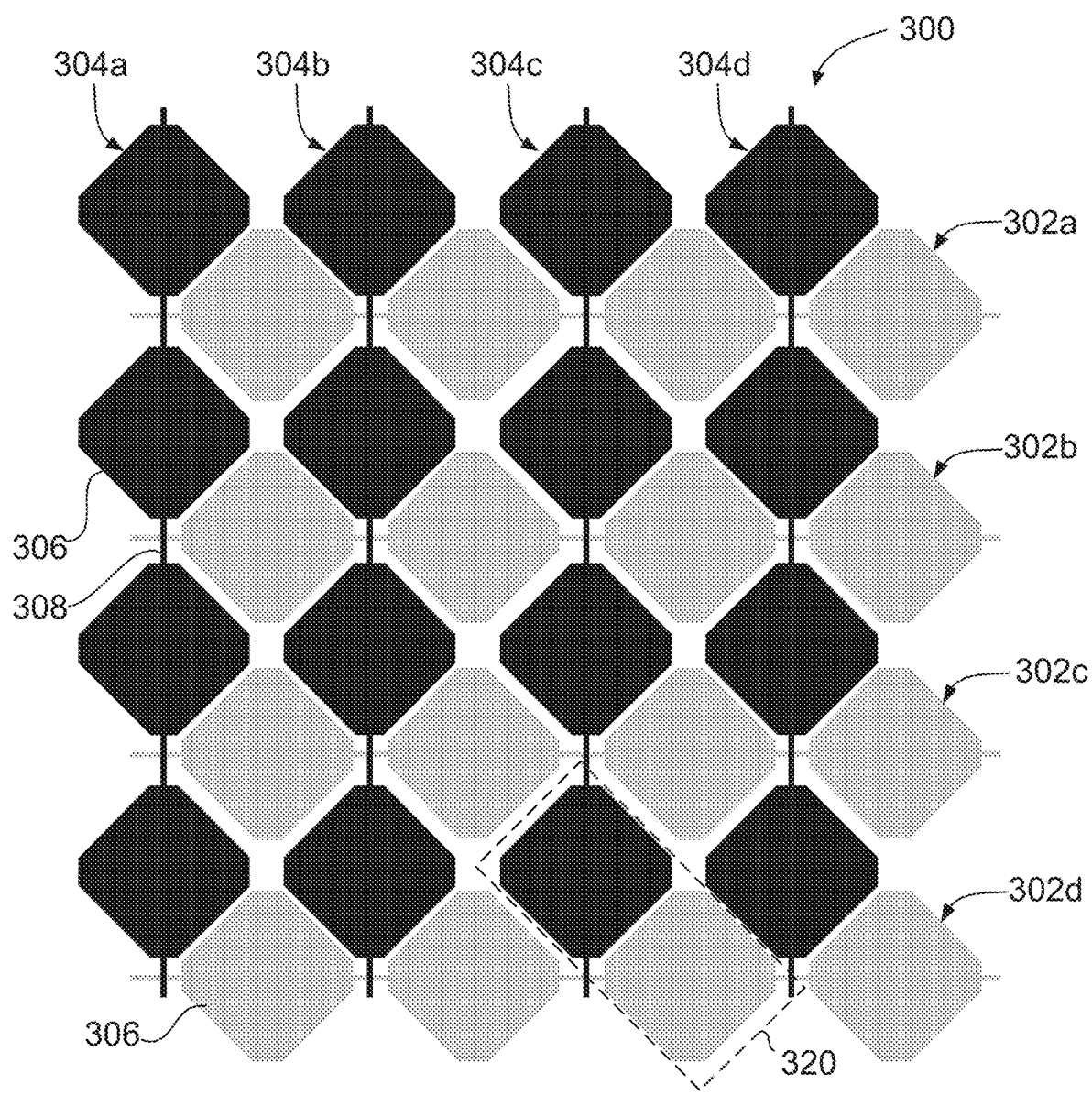
FIG. 3 is a layout view of an example electrode array for a capacitive touch sensor.

FIG. 3 shows a layout of a typical electrode array 300 for a capacitive touch sensor apparatus. Similar to the touch sensor apparatus 100 of FIG. 1, the array 300 comprises a set of horizontal (Y) electrodes 302a to 302d and a set of vertical electrodes (X) 304a to 304d that are in a simple criss-cross arrangement. Each of the electrodes 302a to 302d and 304a to 304d has a diamond pattern similar to the embodiment in FIG. 1. Specifically, each electrode comprises a plurality of diamond shaped pads 306 that are arranged in series and interconnected by thin connector strips 308.

In FIG. 3, and in other electrode layouts shown in the drawings, different shading types or colors are used simply to visually distinguish X electrodes from the Y electrodes. The different shading or coloring does not imply different conductor compositions. Conversely, embodiments are not limited to all electrodes having a same or similar conductor composition.

The pattern of the array 300 in FIG. 3 may be considered a plurality of "Cells", where each Cell contains one diamond electrode pad 306 of a Y electrode 302a, 302b, 302c or 302d and one adjacent diamond pad 306 of a X electrode 304a, 304b, 304c or 304d. One such example Cell of the array 300 is indicated with the stippled line boundary as cell 320. When used in a self-capacitance touch screen, one of the pair of diamond electrode pads 306 of a Cell is used to detect the X-axis presence of a finger and the other is used to detect the Y-axis presence of a finger. As a finger is moved between two electrodes the finger coupling capacitance changes rapidly. Conversely, as a finger moves across a single electrode the capacitance may stay fairly constant. Thus, if only the tip of the finger touching and it is centered on one Y electrode (302a, 302b, 302c, or 302d) there may be very little finger over the adjacent X electrode (302a, 302b, 302c, or 302d), or vice versa. As a result, detecting and extrapolating the exact X-axis and Y-axis location of the finger may be very difficult.

For each Cell in FIG. 3 there is: one cross-over capacitance between the X and Y electrodes per Cell; one mutual X to Y electrode capacitance change due to a finger presence; one self-capacitance to ground change due to a finger presence; and one inter-cell capacitance transfer to finger movement distance. The transitions between the Cells are fairly abrupt. The transitions between adjacent electrodes are spread over approximately 25% of the spacing between the electrodes.

In a simple criss-cross electrode grid used for capacitive sensors (as shown in FIGS. 1 and 3), each X and Y electrode travels in a respective straight line, and each X electrode overlaps (at an intersection or "crossover") with each of the Y electrodes, and vice versa. The total number of pads (for interconnected pad type strips) may be approximately equal to the number of crossovers.

Whenever one electrode crosses over another electrode a fixed mutual-capacitor is formed related to the crossover area. The crossovers may, thus, introduce a crossover capacitance that increases with the number of crossovers. This crossover capacitance may not be affected by a fingers presence and may dilute the signals that are used to detect both mutual and self-capacitance changes, thereby reducing signal-to-noise ratio.

For self-capacitance configurations in particular, the high number of crossovers in a typical criss-cross electrode grid pattern may cause undesirable effects due to shielding. At each crossover, an upper electrode crosses over (i.e. overlaps) a lower electrode. A finger or object touching the sensor panel at or near an electrode crossover may have less capacitive coupling to the lower electrode, due to some shielding from the upper electrode. The signal change detected may, thus, be reduced due to a lower signal-to-noise ratio. There may also be variability/unpredictability in the signals received by the shielded lower electrode. As a result, signal levels may depend substantially upon whether the finger/object is close to a crossover or not. Due to high number of crossovers in a simple grid pattern, this variability may cause significant difficulties in reliably determining touch position consistently across the touch panel.

Thus, utilizing a pattern that reduces crossovers of the X and Y electrodes may increase signal-to-noise ratio and reliability of touch sensing calculations. Patterns that reduce crossovers, relative to the traditional criss-cross grid, may thereby reduce electrode shielding issues and reduce the base capacitance level. Such patterns may, therefore, improve the signal-to-noise ratio output from the touch sensor, thereby resulting in better detection.

For mutual capacitance configurations, it may be desirable to increase the overall close-side-by-side-proximity distance shared between each pair of X and Y electrodes. Increasing the distance over which the X-Y electrode pair are side-by-side may increase the mutual capacitance change due to a touch (where a finger or other object replaces air as dielectric). This may, in turn, produce larger swings in touch capacitance compared to fixed (non-touch) capacitance. The larger swings in capacitance may result in clearer (less diluted) touch signals in mutual capacitance designs. However, for conventional straight electrode strips comprising interconnected diamond pads, the distance over which an X-Y electrode pair is proximate to each other is limited to a single pair of proximate diamond pads (one from each electrode), as illustrated by the example "Cell" 320 of FIG. 3.

According to some embodiments, the rows and columns of the touch sensor pattern may comprise more than simple linear strips across the screen. The electrodes in some embodiments each incorporate a branching pattern that may allow the electrodes to work better with neighboring electrodes. Collectively, the patterned electrodes may allow the touch area to provide signals with more information and higher signal to noise ratio compared to other arrangements (or patterns) of touch area capacitive sensor electrodes. According to some embodiments, the branching pattern of electrodes may be designed to: reduce or minimize crossover (intersection) of electrodes; feather or interleave portions of adjacent electrodes; increase coverage of the electrodes; and/or manage proximity between electrodes. Branching and/or interleaved electrode designs may also provide smoother transitions between adjacent electrodes as a finger slides along the screen due, which may benefit both self-capacitance and mutual-capacitance touch screens. Such designs may also provide additional benefits such as: higher sensor resolution capability based on more and better touch information; and/or allowing use of a 'coarser' (lower cost & parts count) touch screen without loss of sensor resolution.

In some embodiments, a capacitive touch sensor apparatus comprises a plurality of touch sensor electrodes arranged on a substrate, wherein each electrode has a branching pattern. More particularly, each electrode comprises a primary electrode strip and one or more electrode strip branches extending from the primary electrode strip. The electrode strip branches may comprise a respective first order branch portion extending from the corresponding primary electrode strip. The first order branch portion may be orthogonal to the primary electrode strip. The branches may also include second, third and/or fourth order branch portions, etc. Any branch portions of an order higher than first order may collectively be referred to as "higher order" portions herein. Each higher order branch portion extends from a branch portion of the next lowest order. Each higher order branch portion may also be orthogonal to the branch portions of the next lowest order. The electrode branches (including the first and possibly higher order portions) of each electrode may be interleaved with the electrode branches of other electrodes. This type of branching pattern may reduce the number of electrode cross overs for a given area of finger contact compared to a simple criss-cross grid pattern. The branching pattern may also have additional benefits as explained in more detail below.

The branching electrodes and substrate may be in the form of a touch sensor panel (which may further include other elements such as resonance circuit components for each electrode). The apparatus may further include a controller connected to the touch sensor panel.

Figure 4:
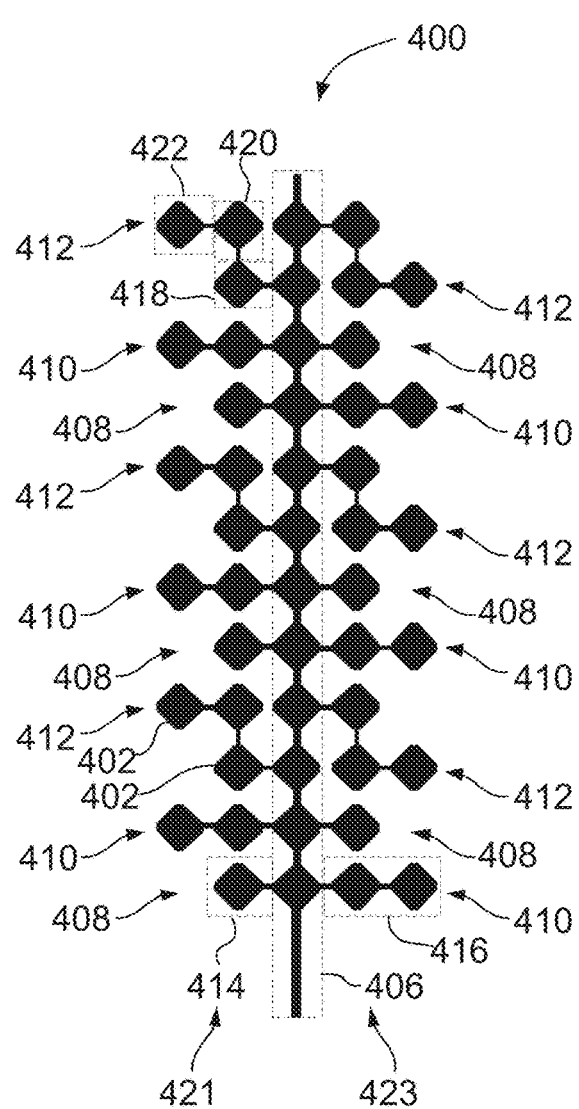
FIG. 4 is a layout view of an exemplary touch sensor electrode incorporating a branching pattern according to some embodiments.

FIG. 4 is a layout view of an exemplary touch sensor electrode 400 incorporating a branching pattern according to some embodiments. The electrode 400 in this example comprises diamond shaped pads 402 that are spaced apart and interconnected to form electrode strips, similar to the embodiments in FIGS. 1 and 3. However, embodiments are not limited to interconnected electrode pads, or to diamond shaped pads. The electrode 400 will typically be deposited on a substrate (not shown), similar to other embodiments described herein. Each pad 402 may, for example, have a width and/or height in the range of approximately 4 mm to approximately 8 mm, although embodiments are not limited to this size range.

The exemplary electrode 400 comprises a primary electrode strip 406, which in isolation is similar to the electrodes in FIGS. 1 and 3. However, the electrode 400 also includes a plurality of electrode strip branches 408, 410 and 412 extending from the primary electrode strip 406. In this example, the electrode strip branches are broadly grouped into branches 408 having a first configuration, branches 410 having a second configuration, a branches 412 having third configuration. However, in other embodiments, the electrode strip branches may all have the same configuration.

The branches 408 of the first configuration comprise a first order branch 414 extending perpendicularly away from the primary strip 406. The first order branch 414 includes only one diamond pad 402.

The branches 410 of the second configuration also comprise a first order branch 416 extending perpendicularly from the primary strip 406. However, the first order branches 416 include two diamond pads 402.

The branches 412 of the third configuration comprise a first order branch 418 extending perpendicularly from the primary strip 406, a second order branch 420 extending perpendicularly from the first order branch 418, and a third order branch extending perpendicularly from the second order branch 420. The first, second and third order branches 418, 420 and 422 each include one diamond pad 402 in this example (although they may each include more than one pad in other embodiments, and the lengths of the various branch portions may vary). Branches of the electrodes are not limited to the specific configurations shown in FIG. 4.

Figure 6:
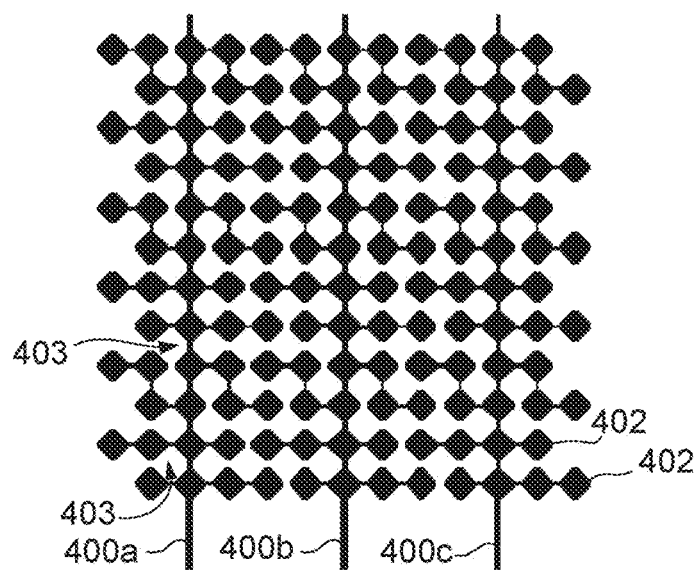
FIG. 6 shows three vertical ("X") electrodes, each in the form of the electrode of FIG. 4.

The electrode strip branches 408, 410 and 412 are arranged in a cyclic sequential order, with the electrode strip branches 408, 410 and 412 on one side 421 of the primary strip 406 being mirrored (in the axial direction of the primary electrode strip 406) and offset with respect to the electrode strip branches 408, 410 and 412 on the other side 423 of the primary strip 406. This arrangement allows multiple adjacent electrodes 400 to fit together with electrode strip branches 408, 410 and 412 interleaved as shown in FIG. 6.

Adjacent diamond pads 402 of the exemplary electrode 400 are spaced horizontally and vertically by a discrete interval, such that the pads 402 conform to a grid spacing.

The electrode 400 may be longer or shorter than shown, with more or fewer electrode strip branches 408, 410 and 412, accordingly.

Figure 5:
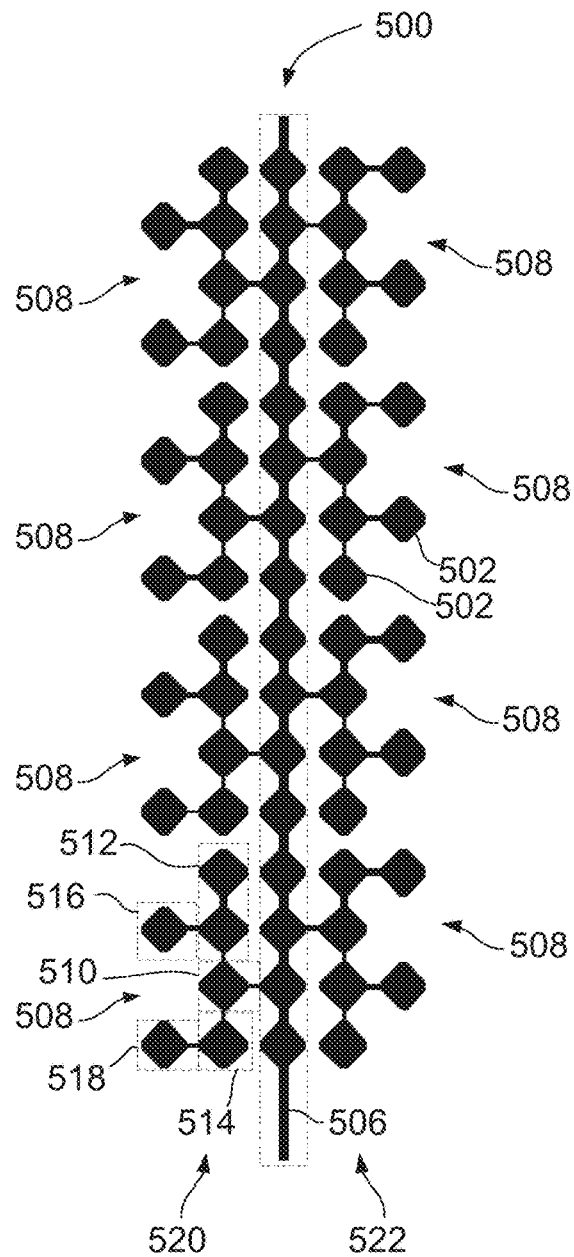
FIG. 5 is a layout view of another exemplary touch sensor electrode incorporating another branching pattern according to some embodiments.

FIG. 5 is a layout view of another exemplary touch sensor electrode 500 incorporating another branching pattern according to some embodiments. The electrode 500 in this example also comprises diamond shaped pads 502 that are spaced apart and interconnected to form electrode strips, similar to the electrode 400 of FIG. 4. The electrode 500 in FIG. 5 will typically be deposited on a substrate (not shown), similar to other embodiments described herein.

The exemplary electrode 500 also comprises a primary electrode strip 506 and a plurality of electrode strip branches 508. The electrode strip branches 508 each have essentially the same configuration. Each of the electrode strip branches 508 includes a first order branch 510 (including one pad 502) extending from and orthogonal to the primary strip 506. Two second order branches 512 and 514 (including two pads 502 and one pad 502 respectively) extend from the first order branch 510. Each electrode strip branches 508 further includes two third order branches 516 and 518 (including one pad 502 each), each extending from a respective one of the second order branches. The second order branches 512 and 514 and the third order branches 516 and 518 collectively form an F-shape.

Figure 7:
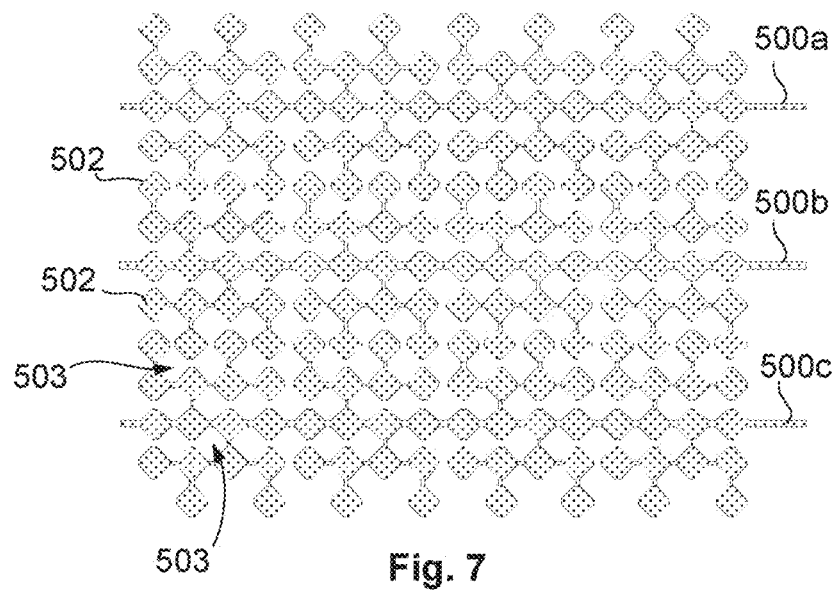
FIG. 7 shows three horizontal ("Y") electrodes, each in the form of the electrode of FIG. 5.

The electrode strip branches 508 on one side 520 of the primary strip 506 are again mirrored (in the primary axial direction) and offset with respect to the electrode strip branches 508 on the other side 522 of the primary strip 506. This arrangement allows multiple adjacent electrodes 500 to fit together with electrode strip branches 508 interleaved as shown in FIG. 7.

Adjacent diamond pads 502 of the exemplary electrode 500 are spaced horizontally and vertically at a discrete interval, such that the pads 502 conform to grid-type spacing. The electrode 500 may be longer or shorter than shown, with additional or fewer electrode strip branches 508, accordingly. The pads 502 of the electrode 500 may have substantially the same size and shape as the pads 402 of the electrode 400 in FIG. 4, although the pads of one electrode pattern may differ from those of another electrode pattern in other embodiments.

The electrodes 400 and 500 in FIGS. 4 and 5 are designed to be arranged together in a touch sensor region.

FIG. 6 shows three vertical ("X") electrodes 400a to 400c in the form of the electrode 400 of FIG. 4. Each of the "X" electrodes 400a to 400c partially overlaps with its neighboring electrode(s) 400a, 400b and/or 400c. More particularly, the electrode strip branches 408, 410 and 412 of adjacent electrodes 400a to 400c are interleaved with each other. The pads 402 of the electrodes 400a to 400c collectively form a grid with diamond shaped voids 403 between the pads 402.

FIG. 7 shows three horizontal ("Y") electrodes 500a to 500c in the form of the electrode 500 of FIG. 5. Each of the "Y" electrodes 500a to 500c also partially overlaps with its neighboring electrode(s) 500a, 500b and/or 500c. More particularly, the electrode strip branches 508 of adjacent electrodes 500a to 500c are interleaved with each other. The pads 502 of the electrodes 500a to 500c collectively form a grid with diamond shaped voids 503 between the pads 502.

Figure 8:
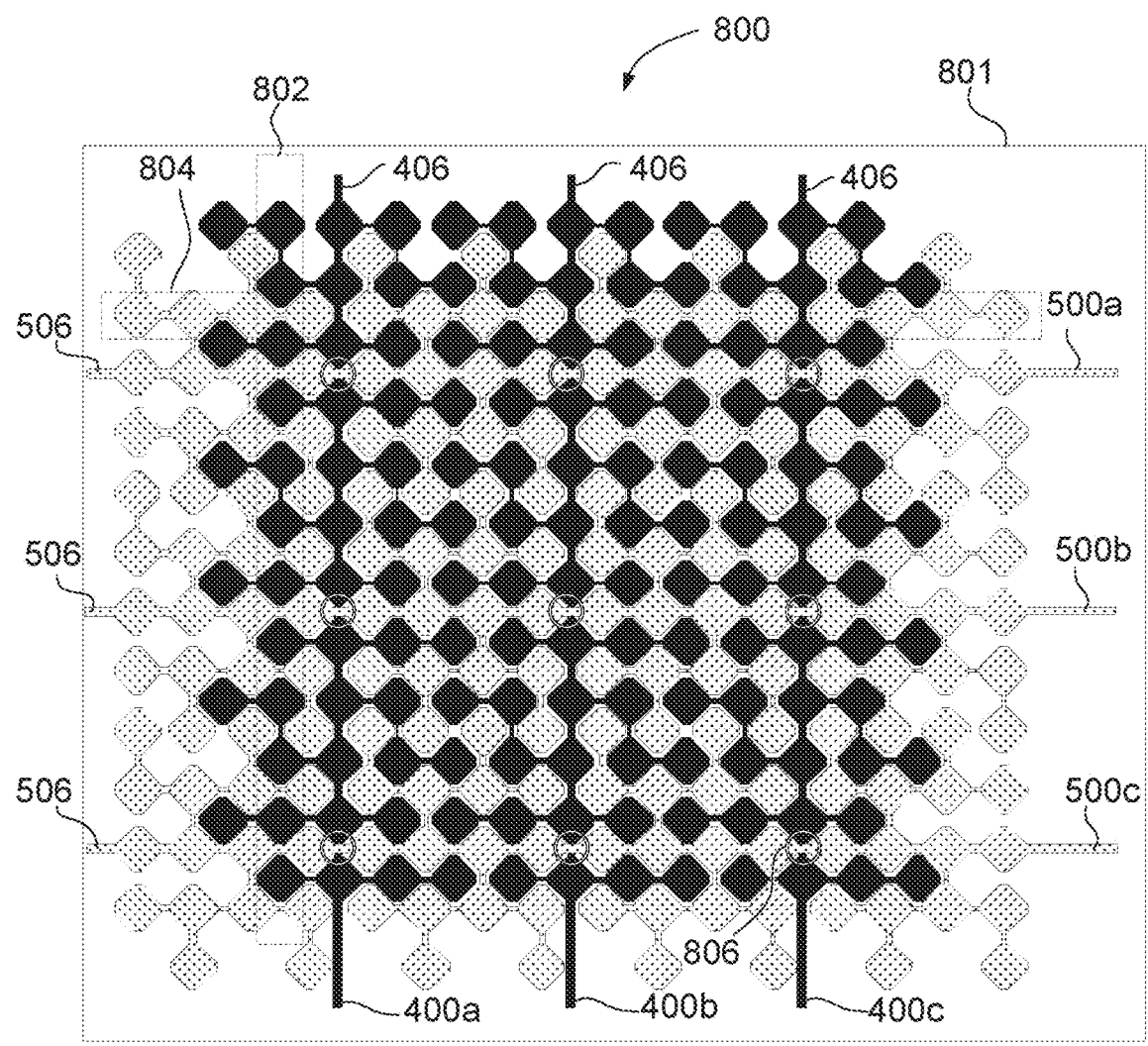
FIG. 8 is a top plan view of a touch sensor apparatus 800 including a substrate and the X and Y electrodes of FIGS. 6 and 7 combined on the substrate, according to some embodiments.

FIG. 8 shows touch sensor apparatus 800 (in the form of a panel) including a substrate 801, with the X electrodes 400a to 400c and the Y electrodes 500a to 500c arranged thereon. As shown, the pads 402 of the X electrodes 400a to 400c are positioned in the voids 503 (FIG. 7) between the Y electrodes 500a to 500c. Similarly, the pads 502 of the Y electrodes 500a to 500c are positioned in the voids 403 (FIG. 6) between the X electrodes 400a to 400c.

The electrode layout of the apparatus 800 in FIG. 8 includes three X electrodes 400a to 400c resulting in approximately 12 complete columns 802 of X electrode pads 402 and three Y electrodes 500a to 500c resulting in 12 complete rows 804 of Y electrode pads 502. To achieve the same number of columns and rows of pads using the simple criss-cross style grid of FIG. 1, there would need to be 12 X electrodes and 12 Y electrodes, with a resulting 144 crossovers. By contrast, the electrode layout of the apparatus 800 in FIG. 8 only has 9 crossovers, indicated by small circles (e.g. circle 806) in FIG. 8. In this example, only the primary electrode strips (406/506) of the electrodes (400a to 400c and electrodes 500a to 500c) crossover. The electrode strip branches (408, 410, 412, 508 labeled in FIGS. 4 and 5) extending from the primary electrode strips 406/506 do not form crossovers (i.e. overlap with each other). Rather, the electrode strip branches interleave or fit together similar to puzzle pieces. In other embodiments, electrode strip branches extending from the primary electrode strips may form one or more crossovers, while still increasing the ratio of pads to crossovers compared to simple criss-cross grid configurations. For example the ratio of pads to crossovers may be at least four to 1. In FIG. 8, the ratio is approximately 16 pads to 1 crossover, for each set of electrodes. Thus, considering both the X and Y electrodes together, the ratio is about 32 to 1.

The X electrodes 400a to 400c and the Y electrodes 500a to 500c may be selectively driven and the corresponding output responses monitored to detect changes in output levels caused by touch events, as discussed above. The X electrodes 400a to 400c and the Y electrodes 500a to 500c may be connected to a controller individually for time multiplexing based scanning (e.g. electrodes driven at different times by the same electronic tone frequency). Alternatively, the X electrodes 400a to 400c and the Y electrodes 500a to 500c may be driven using frequency multiplexing methods described herein (e.g. groups of electrodes driven at the same time by input signals that cycle through resonant frequencies). The controller may, for example be in the form shown in FIG. 2 or 17, although embodiments are not limited to those controller configurations.

In the examples of FIGS. 4 to 8, each electrode 400a to 400c and 500a to 500c branches or fans out to partially fill multiple pad row or pad column positions. Despite the multi-directional branching pattern of the individual electrodes, the electrodes are still referred to herein as either X (vertical) or Y (horizontal) electrodes based on the orientation of the primary strips 406 (FIG. 4) and 506 (FIG. 6) of the electrodes 400a to 400c and 500a to 500c.

This type of branching electrode pattern exemplified in FIG. 8 may be referred to as an "advanced matrix". The branching electrode pattern may soften transitions between adjacent X and Y electrodes, thereby allowing better interpolation of the position of a touch event. The branching electrode pattern may improve the signal to noise ratio as finger capacitance changes much larger relative to fixed crossover capacitance.

As also explained above, such patterns may minimize or reduce the number of crossovers required for a capacitive touch sensor. The term "minimized" does not mean that the number of overlaps/intersects is the least amount possible or zero, but rather that the number is reduced compared to a simple criss-cross pattern (e.g. FIG. 1). Some overlaps/intersections will typically be included. For example, completely eliminating overlaps/intersections may be accomplished with long narrow electrodes, but such electrodes may have high resistance signal paths, thereby reducing signal-to-noise ratio. A balance may be achieved that minimizes shielding and base capacitance between electrodes without degrading touch signals due to high resistance signal paths.

Embodiments are not limited to the particular branching electrode patterns shown in FIGS. 4 to 8. Various branching patterns may be used. Other patterns may include larger or smaller branching portions that provide more or less interleaved space therebetween. As one example, each branching portion may only include a first order branch that extends perpendicular to the main strip.

Figure 9:
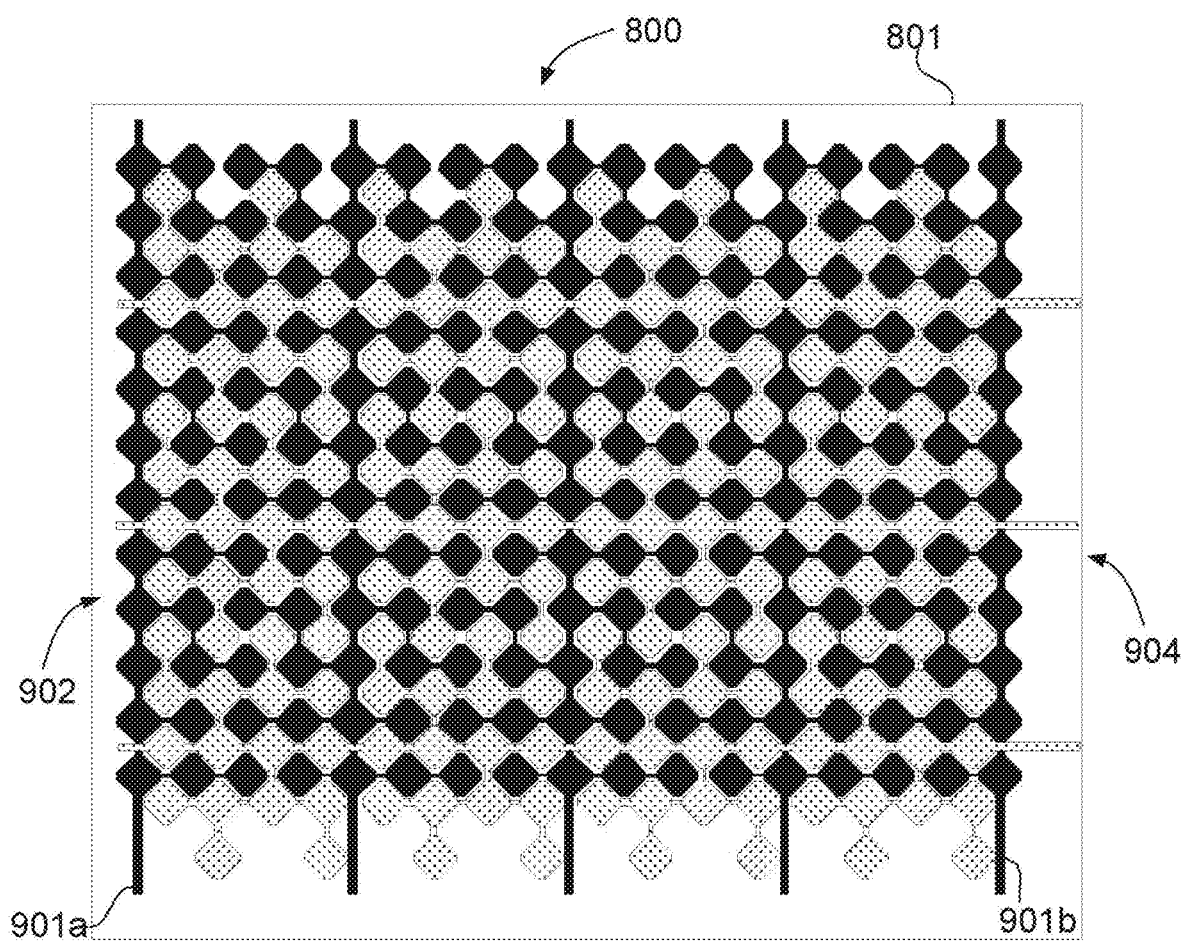
FIG. 9 is a top plan view of a modified version of touch sensor apparatus of FIG. 8.

The electrode pattern of FIG. 8 may be expanded along the X axis and/or the Y axis. More and/or longer electrodes may be used. FIG. 9 shows a modified version of the touch sensor apparatus 800 of FIG. 8, including additional side electrodes 901a and 901b that are similar to the other X electrodes 400a to 400c, but include only inward facing electrode strip branches 408, 410 and 412 (i.e. electrode strip branches on only one side of the primary electrode strips 406). Side electrodes 901a and 901b provide additional X electrode positions close to opposite sides 902 and 904 of the apparatus 800. Similar modified top and bottom Y electrodes may also be included to fill in extra voids between the pads of the X electrodes and to bring the area covered by Y electrodes closer to the top and bottom of the panel.

For a set of electrodes for a capacitive touch sensor, the area of a given X electrode confined by adjacent X electrodes and a given Y electrode confined by adjacent Y electrodes (i.e. the width between adjacent electrically separated X electrodes, and the height between adjacent electrically separated Y electrodes) may be referred to as a "Cell". Each Cell is split into two electrically separate electrode portions (one X electrode portion, and one Y electrode portion). The X electrode of the Cell is used to detect a finger's horizontal position and the Y electrode of the Cell is used to detect a finger's vertical position.

The shape of the two electrodes within each "Cell" may have significant effects on touch performance in both the X and Y planes with the ideal being an optimization or balance between the following characteristics: a) increased capacitance that couples to a finger if present, b) decreased fixed capacitance to other adjacent and crossing over electrically separated traces, c) making the change of capacitance to it and adjacent electrically separated "Cells" as a finger is moved as linear as possible so software can interpolate where a finger is between "Cells", and d) minimizing large areas where the horizontal resolving Cell electrode prevents the vertically resolving Cell electrode from being coupled to the finger (or other touching object) and vice versa.

Figure 10:
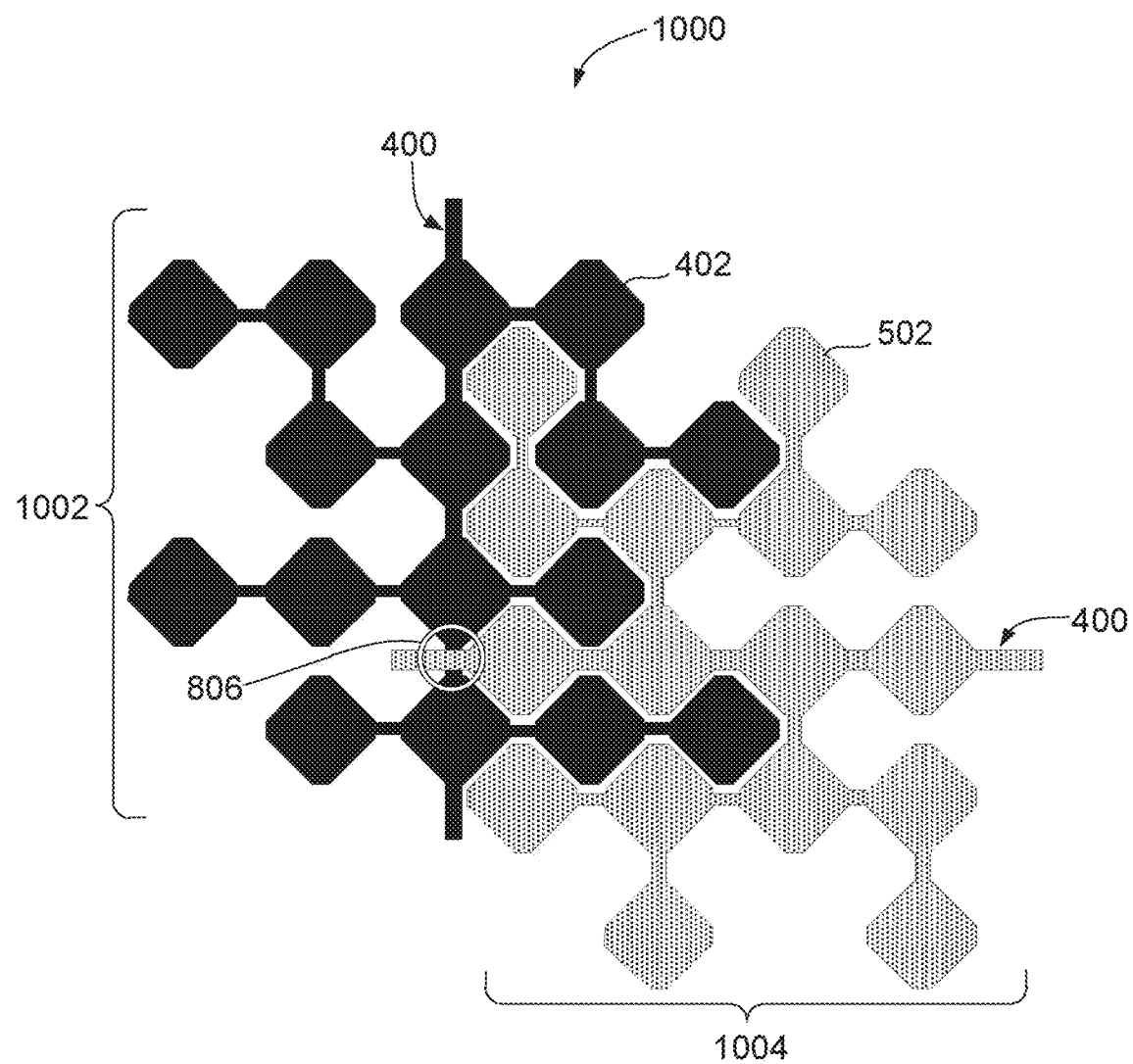
FIG. 10 is a view of one "Cell" of the example touch sensor apparatus of FIG. 8.

FIG. 10 shows an example "Cell" 1000 of the example touch sensor apparatus 800 of FIG. 8. The example Cell includes a portion 1002 of one an X electrode 400 and a portion 1004 of a Y electrode 500. The crossover or intersection 806 between the electrodes 400 and 500 (identified by a small circle) may be referred to as a "crossover coupling" although the electrodes do not actually contact one another and are separated by an insulating layer (not shown). In FIG. 10, Cell transitions are spread across the Cell. Relative to a Cell 320 shown in FIG. 3, the Cell 1000 in FIG. 10 may have one or more of the following characteristics: one cross-over capacitance (between the X and Y electrodes 400 and 500) per Cell; approximately eight times the mutual X to Y capacitance change due to a finger presence; approximately twice the self-capacitance to ground change due to a finger presence; and approximately 5.7 times the inter-cell capacitance transfer finger movement distance (i.e. softer edge transitions). The transitions between adjacent electrodes are spread over approximately 66% of the spacing between the electrodes.

As shown, the Cell 1000 has about 16 X electrode pads 402 and 16 Y electrode pads 502 (for a total of 32 pads), but only one crossover 806. By comparison, a traditional Cell for a simple criss-cross design (e.g. FIG. 3) has one crossover for each X electrode pad and Y electrode pad pair. In other embodiments, a Cell may have more than one crossover (e.g. due to one or more crossovers in the interleaved branching portions of the electrodes), while still increasing the ratio of pads to crossovers compared to the criss-cross design of FIG. 3. For example, a Cell may have two or three crossovers total, although more than one crossover may reduce performance compared to the single crossover cell design in FIG. 10.

In the examples of FIGS. 4 to 10, the various diamond shaped pads 402/502 of the electrodes have are substantially uniform in size. However, in some embodiments, the size of pads (e.g. diamond shaped pads) of electrodes are not uniform.

FIG. 11 is a layout of another example electrode 1100 similar to the electrode 400 in FIG. 4. However, the electrode 1100 has a variable pad sizes, as explained in more detail below.

The electrode 1100 has a primary electrode strip portion 1106 and electrode strip branches 1108, 1110 and 1112. The primary electrode strip portion 1106 is similar to the primary electrode strip portion 406 of the electrode 400 in FIG. 4. The electrode strip branches 1108, 1110 and 1112 are also similar in layout to the electrode strip branches 408, 410 and 412 of the electrode 400 in FIG. 4. However, the size of the diamond shaped pads 1102a, 1102b, 1102c is variable rather than uniform. The diamond shaped pads 1102a of the primary electrode strip portion 1106 are all the same size. All pads 1102b aligned in the columns 1120a and 1120b adjacent to the primary electrode strip portion 1106 have a same, reduced size relative to the primary electrode strip portion 1106 (approximately ⅔ of the size of the pads 1102a of the primary electrode strip, although size ratios may vary). All pads 1102c in the next-most adjacent columns 1122a and 1122b have a same, further reduced size relative to the pads 1102a and 1102b (approximately ½ of the size of the pads 1102a of the primary electrode strip portion 1106, although size ratios may vary). Thus, for a given pad (1102a, 1102b, 1102c), the size of the pad depends on its position relative to the primary electrode strip portion 1106, with the size of the pads decreasing as the distance from the primary electrode strip portion 1106 increases.

FIG. 12 is a layout of another example electrode 1200 similar to the electrode 500 in FIG. 5. However, the electrode 1200 has a varying pad size. The electrode 1200 has a primary electrode strip portion 1206 and electrode strip branches 1208 that have a similar branching pattern as the electrode 500 in FIG. 5. However, the size of the pads depend on their position relative to the primary electrode strip portion 1206, with the size of the pads decreasing as the distance from the primary electrode strip portion 1206 increases. More specifically pads 1202b aligned in the rows 1220a and 1220b are approximately ⅔ of the size of the pads 1202a of the primary electrode strip. Pads 1202c aligned in the next adjacent rows 1222a and 1222b have a same, further reduced size relative to the pads 1202a and 1202b (approximately ½ of the size of the pads 1202a of the primary electrode strip portion 1206, although size ratios may vary).

Figure 13:
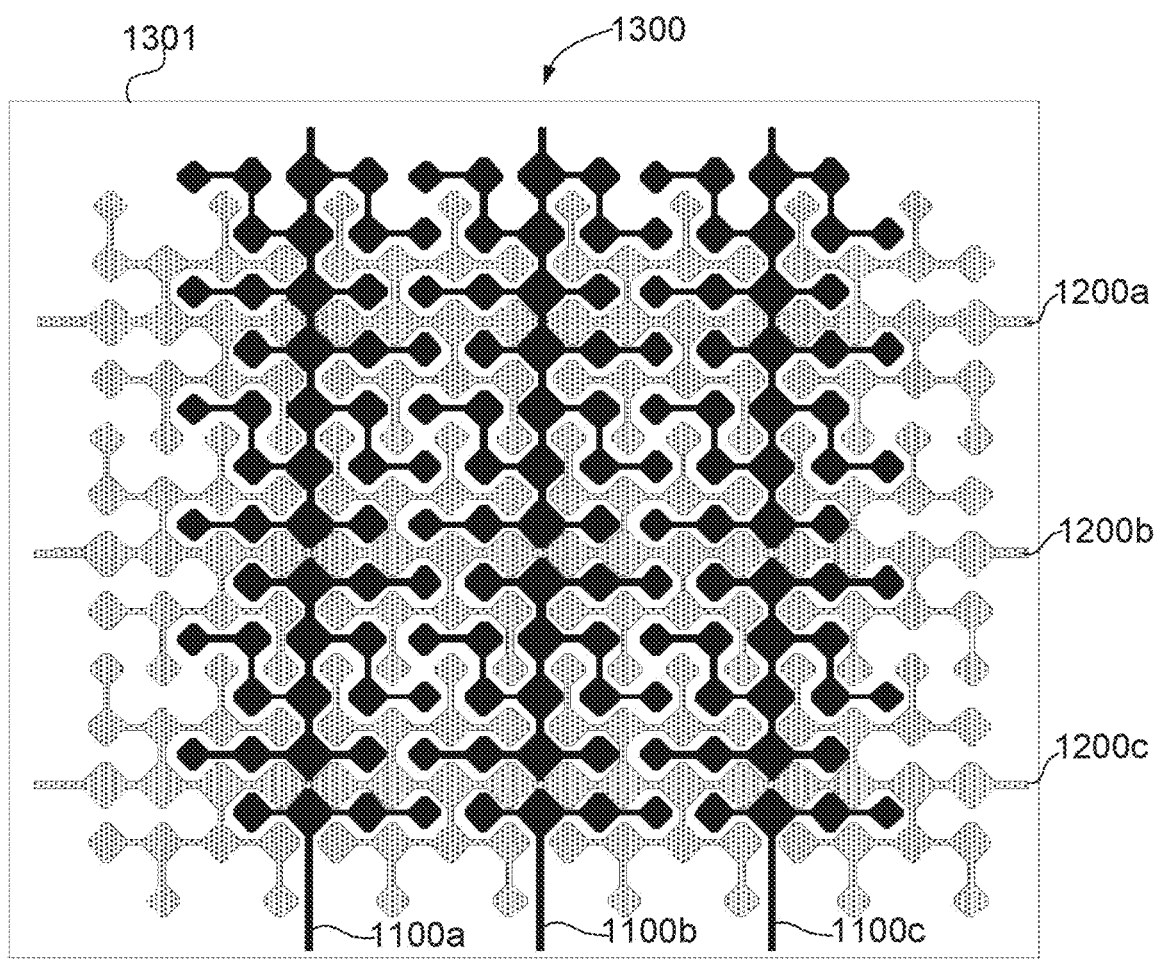
FIG. 13 is a top plan view of a touch sensor apparatus including electrodes in the forms shown in FIGS. 11 and 12, according to some embodiments.

FIG. 13 shows an example touch sensor apparatus 1300 including a substrate 1301, three X electrodes 1100a to 1100c (each similar to the electrode 1100 in FIG. 11) and three Y electrodes 1200a to 1200c (each similar to the electrode 1200 in FIG. 12) combined on the substrate 1301. The touch sensor apparatus 1300 is similar to the apparatus 800 in FIG. 8, but with the variable (decreasing) pad sizes described above.

Figure 14:
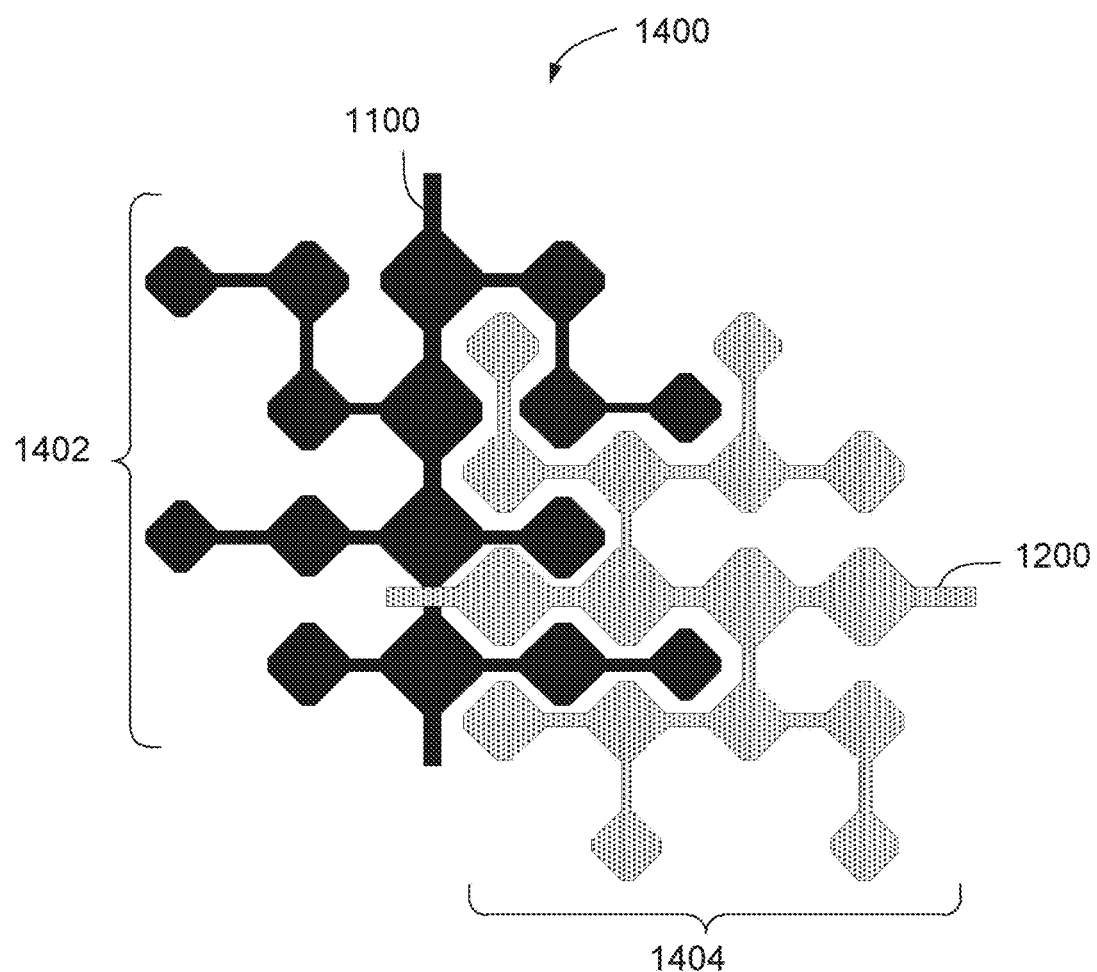
FIG. 14 is a view of one "Cell" of the example touch sensor apparatus of FIG. 13.

FIG. 14 shows an example "Cell" 1400 of the example touch sensor apparatus 1300 of FIG. 13. The example Cell 1400 includes a portion 1402 of one an X electrode 1100 and a portion 1404 of a Y electrode 1200. This pattern of the electrodes may provide even softer transitions between rows and columns allowing better interpolation. The pattern may also provide good Signal-to-Noise ratio as finger capacitance changes larger relative to fixed crossover capacitance, similar to the pattern in FIG. 8. The variable pad sizes shown in FIGS. 11 to 14 may be particularly beneficial for self-capacitance crystal-resonator based circuits. On the other hand, uniform pad sizes, as shown in FIGS. 6 to 10, may be particularly suited to mutual capacitance designs. The transitions between adjacent electrodes are again spread over approximately 66% of the spacing between the electrodes.

The X electrodes 1100a to 1100c and the Y electrodes 1200a to 1200c may be selectively driven and the corresponding output responses monitored to detect changes in output levels caused by touch events, as discussed above. The X electrodes 1100a to 1100c and the Y electrodes 1200a to 1200c may be connected to a controller individually for time multiplexing based scanning (e.g. electrodes driven at different times by the same electronic tone frequency). Alternatively, the X electrodes 1100a to 1100c and the Y electrodes 1200a to 1200c may be driven using frequency multiplexing methods described herein (e.g. groups of electrodes driven at the same time by input signals that cycle through resonant frequencies). The controller may, for example be in the form shown in FIGS. 2 or 17, although embodiments are not limited to those controller configurations.

As another example, for at least some of the branches, the size of the diamond pads may diminish as the branches extend from the primary strip. The primary strip (or trunk) may comprise the largest pads, and the electrode strip branches may have progressively smaller pads as a function of a length of the electrode branch from the primary strip to a given pad.

The branching electrode patterns shown in FIGS. 4 to 14 are shown by way of example, and embodiments are not limited to the particular number or pattern of the electrodes shown. The electrodes shown in these figures may be referred to as "interleaving" electrodes, or electrodes having an interleaved pattern.

The branching and interleaved patterns discussed above (including the exemplary electrode designs of FIGS. 4 to 14) may have various benefits for capacitive touch screens. As discussed above, the branches of electrodes with a branching pattern may be interleaved (i.e. "feathered") with the branches of adjacent or neighboring electrodes, thereby softening the transitions between neighboring electrodes. The interleaved design means that portions of the neighboring electrodes partially overlap in one dimension (e.g. X or Y dimension). In other words, the "width" occupied by the electrode along its axis dimension overlaps with the "width" occupied by another electrode. Calculations to determine finger/object location may be more accurate when based on more information, and the determined location may be more stable if the output signals used to determine the location don't make sharp changes based on slight movements of the finger or other object touching the sensor area. This way, there may be a smoother transition registered as a finger/object moves from one electrode to the next.

Variable size electrode pads (as shown in FIGS. 12 to 14), with the size deceasing as perpendicular distance to the primary strip increases, may further improve the smoothness of transitions. Thus, the overlapping or interleaved design of the electrode patterns shown in FIGS. 4 to 14 may provide for better accuracy and/or stability for determining the X-Y location of a touch event for both self-capacitance and mutual capacitance configurations. This arrangement may also provide a better signal in total on which to base the location determination. With self-capacitance configurations, for example, the electrode (channel) most central to a touch event may experience a slightly reduced touch signal because signal size in self-capacitance sensors depends on the area of overlap between the finger and the electrode and some of the branching pattern may extend beyond the finger. However, the neighboring channels (which typically generate a smaller and less noise tolerant signal) may see their touch signals increased because the branches of the neighboring electrodes will extend under the finger more than in non-branching designs. Overall, this may provide better information determination of touch location.

Another possible advantage to the branching and interleaved electrode design is the ability to more efficiently cover a sensor area with fewer separate electrodes. In other words, total area coverage per electrode may be increased in comparison to simple criss-cross patterns. There may not be substantial "blank areas" (i.e. area of the panel not occupied by electrodes) not covered either by an X or Y. Since the signal size depends upon the contact or overlap area with a touching/nearby finger/object, increasing or maximizing the coverage area of the electrodes may increase the signal to noise ratio of the output signals processed by the controller (thereby improving the system's capability to determine locations). Furthermore, using fewer electrodes to cover a given area may reduce the amount of "crosstalk" between electrodes.

The set of electrodes used to sample one axis may optionally have, broadly speaking, the same or similar pattern as the set of electrodes used to sample the other axis. This may allow the two sets of electrodes to fit together, maximize area, minimize overlap and may provide consistent, predictable signals indicative of finger/object location. Such patterns may favour electrodes otherwise predisposed to having lower quality signals.

Optionally, some or all of the pads of the electrodes in a lower conductor layer may be slightly enlarged relative to some or all of the pads of electrodes of an upper conductor layer. The reason for this is that the system determines location about as well as its weakest signals, which may be from the lower layer, which may have weaker capacitive coupling with a finger (while the upper layer may have a better signal to noise ratio than needed). Thus, some area covered by the upper layer electrodes may be sacrificed in order to improve the contact/overlap area of the lower layer, thereby possibly improving the signal to noise ratio for the lower layer.

Another possible method to improve signal-to-noise ratio in some embodiments is to provide sufficient distance between adjacent electrodes (i.e. reduce proximity between electrodes), which may reduce the base capacitance of electrodes. This proximity-reduction may limit maximization of electrode area. Thus, a trade-off or balance in order to optimize signal-to-noise ratio may be determined. Furthermore, conductors in the set of electrodes used to sample one axis may be positioned to avoid being in close proximity to the conductors in the set of electrodes used to sample the other axis. To a modest degree, this may reduce the amount of capacitance between any one electrode and others, thereby reducing base capacitance. By utilizing one or more of the various pattern design characteristics discussed above, performance of the touch panel device may be improved.

Figure 15:
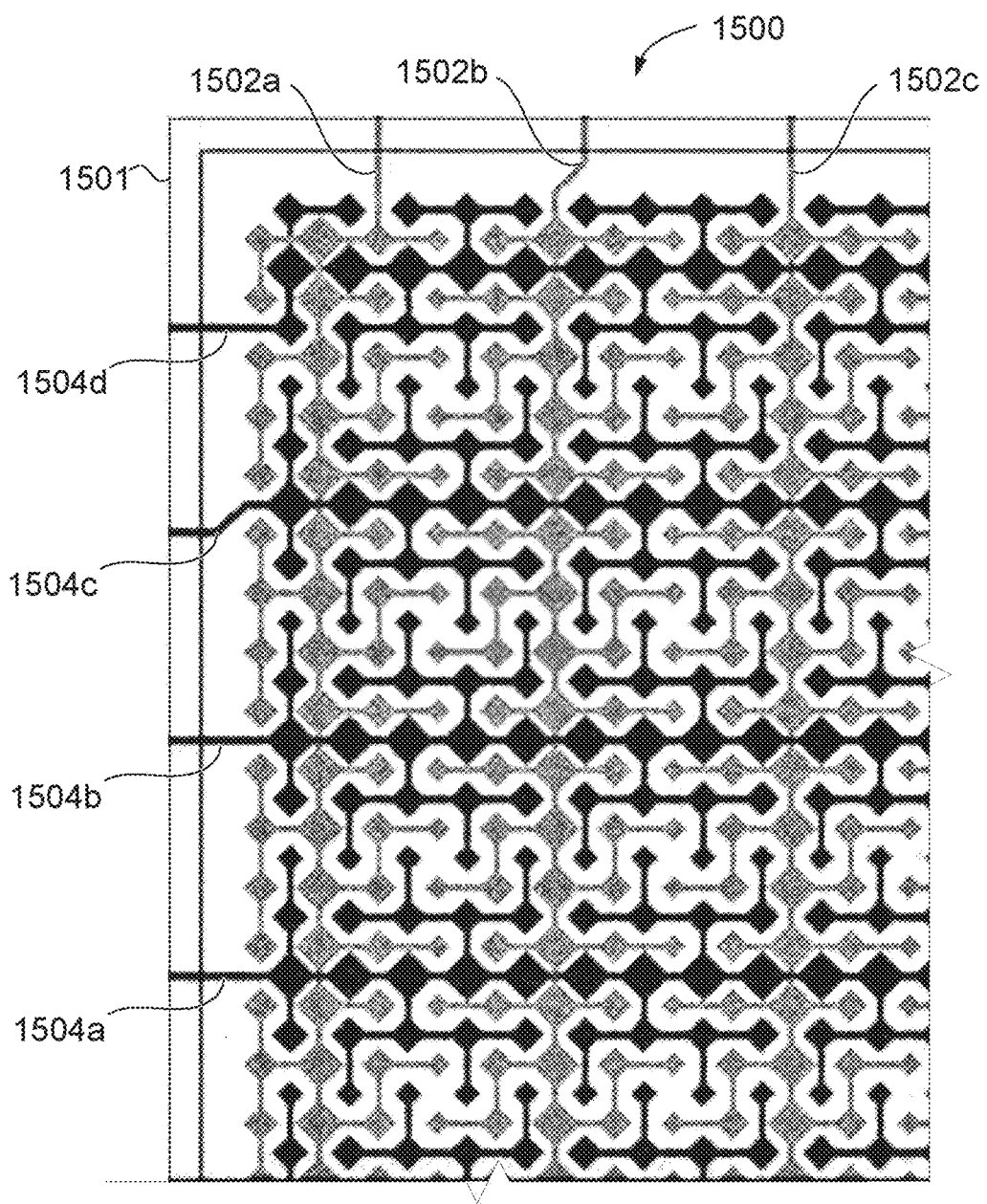
FIG. 15 is a partial top plan view of another example touch sensor apparatus according to some embodiments.

FIG. 15 is a top plan partial view of an example touch sensor apparatus 1500 (in the form of a touch sensor panel). The apparatus 1500 comprises a substrate 1501 and with electrodes arranged thereon. The electrodes are in a pattern similar to the pattern of FIGS. 13 and 14. Only a portion of the apparatus 1500 is shown, including X electrodes 1502a to 1502c and Y electrodes 1504a to 1504d. Each electrode has a respective input/output connection that may be connected to a touch sensor controller (not shown). The touch sensor controller may scan each electrode/channel to determine the location of a touch event, as described above.

Figure 16:
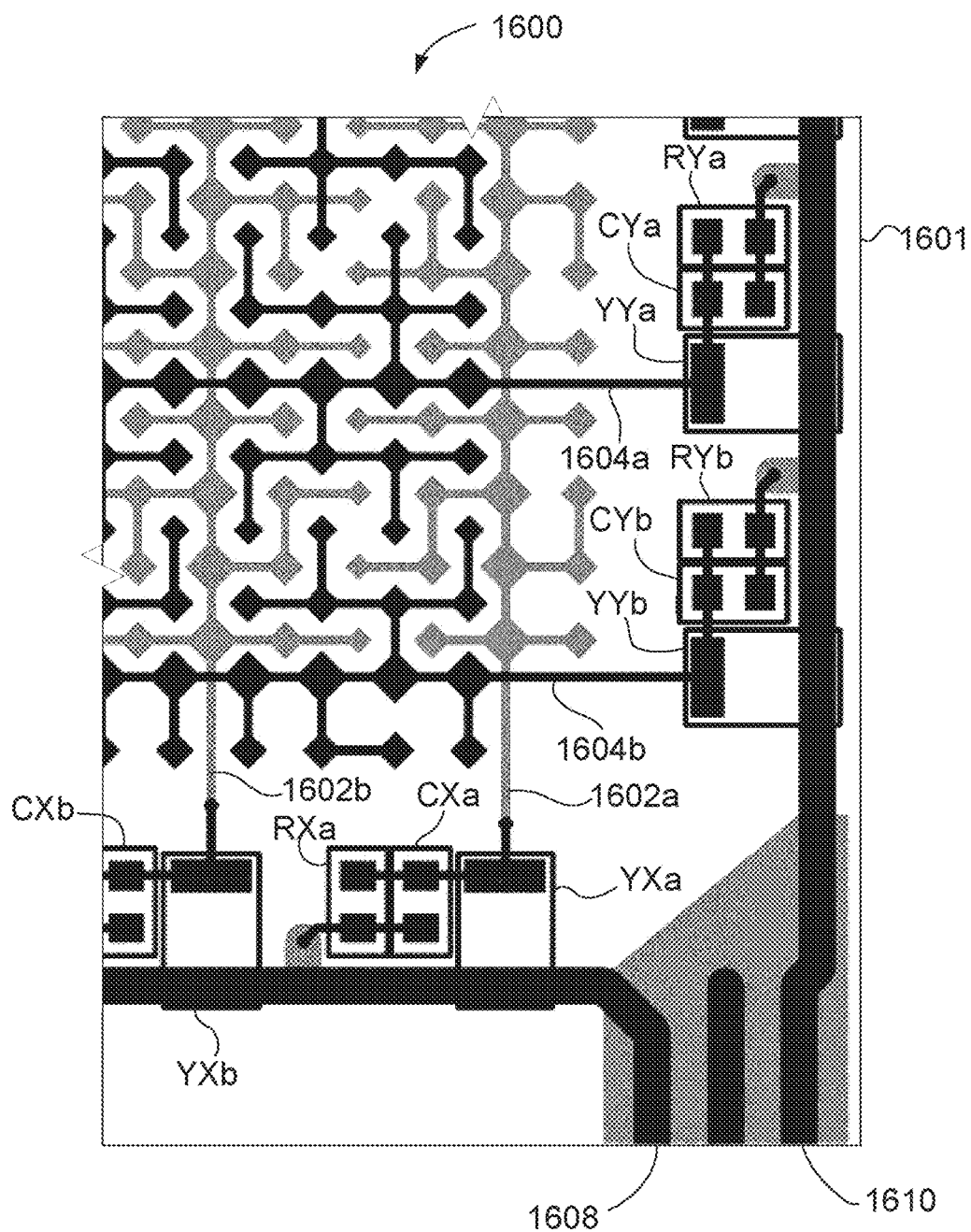
FIG. 16 is a partial top plan view of another example touch sensor apparatus according to some embodiments.

FIG. 16 is a top plan partial view of an example touch sensor apparatus 1600 (in the form of a touch sensor panel). The apparatus 1600 comprises a substrate 1601 and with electrodes arranged thereon. The electrodes are in a pattern similar to the pattern of FIGS. 13 and 14. Only a portion of the apparatus 1600 is shown, including X electrodes (1602a, 1602b, etc.) and Y electrodes (1604a, 1604b, etc.). In this example, each of the X electrodes (1602a, 1602b, etc.) are connected to a respective capacitance element (CXa, CXb, etc.), resonance element (YXa, YXb, etc.) and resistance element (RXa, etc.) to form a resonance circuit. Each resonance circuit for the X electrodes (1602a, 1602b, etc.) has a unique resonance frequency among the X electrodes, so that frequency multiplexing may be used to scan the electrodes. The X electrodes are collectively connected to a first input/output connection 1608 that may be driven with signals at the resonance frequencies to scan the X electrodes.

Similarly, each of the Y electrodes (1604a, 1604b, etc.) are connected to a respective capacitance element (CYa, CYb, etc.), resonance element (YYa, YYb, etc.) and resistance element (RYa, RYb, etc.) to form a resonance circuit. Each resonance circuit for the Y electrodes (1604a, 1604b, etc.) has a unique resonance frequency among the Y electrodes, so that frequency multiplexing may be used to scan the electrodes. The Y electrodes are collectively connected to a second input/output connection 1610 that may be driven with signals at the resonance frequencies to scan the Y electrodes.

As mentioned above, the branching, interleaved electrode embodiments described above and shown in the figures are not limited to use in capacitive touch screens utilizing frequency multiplexing (i.e. resonant circuits with multiple different resonant frequencies). Systems using a single resonant frequency may utilize such interleaving electrode patterns.

Figure 17:
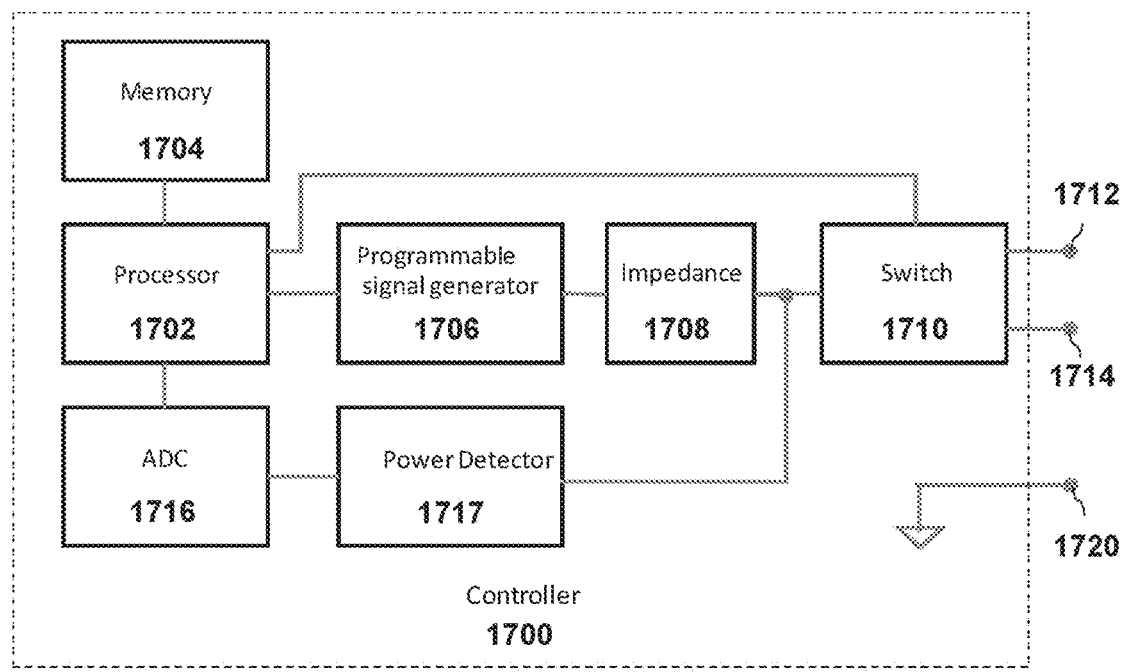
FIG. 17 is a block diagram of an example self-capacitance controller according to some embodiments.

FIG. 17 is a block diagram of a controller 1700 according to another embodiment. The controller 1700 that may be connected to control a frequency multiplexed touch sensor panel (such as the touch panel partially shown in FIG. 16). As mentioned above, other control circuitry arrangements may also be used.

The controller 1700 in this example includes control circuitry comprising a processor 1702 and a memory 1704. The controller 1700 further comprises a programmable electronic tone signal generator 1706, an impedance 1708, a switch 1710, and ADC 1716, and a power detector 1717. The memory 1704 stores computer-executable code thereon for causing the processor 1702 to perform functions described below. In other embodiments, the memory 1704 may be incorporated as part of the processor 1702, rather than external to the processor 1702 as shown in FIG. 17.

The processor 1702 is also connected to communicate with the programmable electronic tone signal generator 1706, power detector 1717 (via the ADC 1716), and the switch 1710. The communication may include providing control signals to the programmable electronic tone signal generator 1706, the power detector 1717 and the switch 1710, as well as receiving, as input, data output from the power detector 1717 (via the ADC). Ground connection 1720 is also shown.

A first output terminal 1712 of the controller 1700 may, for example, be connected to a first input/output connection (e.g. 140 in FIG. 1) to excite horizontal (Y) channels. A second output terminal 1714 of the controller 1700 may, for example, be connected to the second input/output connection (e.g. 144 in FIG. 1) to excite the vertical (X) channels. The controller may similarly be connected to electrodes of the example touch sensor apparatuses 800, 1300, 1500 or 1600 of FIG. 8, 9, 13, 15 or 16. The controller may be part of the touch sensor apparatuses.

Electronic tone signals generated by the tuneable electronic tone signal generator 1706 are selectively output through the switch 1710 to either the first output terminal 1712 or the second output terminal 1714 as directed by the processor 1702. The tuneable electronic tone signal generator 1706 in this example is capable of selectively generating signals at each of the resonant frequencies of the row and column channels. The processor 1702 may control the switch 1710 and the tuneable electronic tone signal generator 1706 to scan each of the channels.

The power detector 1717 in this example is connected to the ADC 1716, which is in turn connected to the processor 1702. The power detector 1717 is connected to the switch 1710 to receive, as input, the response output from the touch sensor panel (for example, the touch sensor panel 1200 in FIG. 12). The power detector 1717 measures the amplitude of the response of the row and column channels. The power detector 1717 receives analog output from the touch sensor panel which is converted to digital values using the ADC 1716. The digital values are compared to expected response levels (e.g. expected response for no touch event) by the processor 1702. Based on the output, the current state of the switch 1710 and the current selected resonance frequency, the processor 1702 determines which of the row and column channels is currently being sampled and the extent to which it is being touched.

Figure 18:
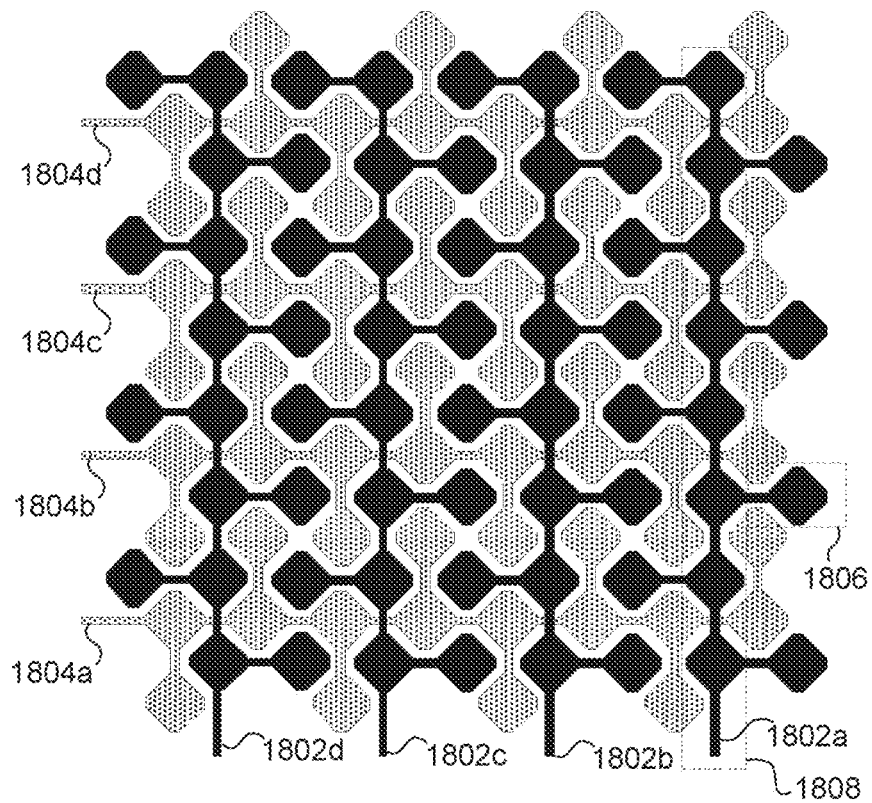
FIG. 18 is a layout of an example touch sensor electrode array according to some embodiments.

FIG. 18 is a layout of an example touch sensor electrode array 1800 according to yet another embodiment. The electrode array 1800 may be arranged on a substrate (not shown) and connected to a controller to drive the array 1800, as with other embodiments described herein. The array includes four X electrodes 1802a to 1802d and four Y electrodes 1804a to 1804d. The X electrodes 1802a to 1802d are parallel to each other and spaced apart (along the X-axis). The Y electrodes 1804a to 1804d are parallel and spaced apart (along the Y-axis) and are perpendicular to the X electrodes 1802a to 1802d. In this example, each electrode (1802a to 1802d and 1804a to 1804d) comprises a series of interconnected diamond shaped pads and includes first order branches extending from a primary electrode strip. Each first order branches comprises a single pad. For example, a first X electrode 1802 includes spaced apparat electrode strip branches 1806 extending from its primary strip 1808. This simple branch pattern results in approximately four pads per crossover for each set of electrodes. That is, for the X electrodes 1802a to 1802d, there are approximately four times as many pads as crossovers with Y electrodes 1804a to 1804d. Similarly, the Y electrodes 1804a to 1804d comprise about four times as many pads as there are crossovers. Considering both X and Y electrodes together, the ration is about eight pads to one crossover.

For the layout 1800 in FIG. 18, there is one cross-over per Cell, and the transitions between adjacent electrodes are spread over approximately 50% of the spacing between the electrodes. In comparison to the cell 300 of FIG. 3, a cell of the layout 1800 may have approximately two times the relative finger modifiable mutual capacitance.

It is to be understood that a combination of more than one of the approaches described above may be implemented. Embodiments are not limited to any particular one or more of the approaches, methods or apparatuses disclosed herein. One skilled in the art will appreciate that variations, alterations of the embodiments described herein may be made in various implementations without departing from the scope of the claims.

The invention claimed is:

1. A capacitive touch sensor apparatus comprising: a substrate; a plurality of touch sensor electrodes arranged on the substrate, wherein each said touch sensor electrode of the plurality of touch sensor electrodes comprises a respective plurality of interconnected electrode pads arranged as: a respective primary electrode strip; and a respective one or more electrode strip branches extending from the respective primary electrode strip, wherein the plurality of touch sensor electrodes comprises first and second sets of electrodes, and the first set of electrodes form crossovers with the second set of electrodes, and, for the each said touch sensor electrode of the plurality of touch sensor electrodes, the respective one or more electrode strip branches of the said touch sensor electrode of the plurality of touch sensor electrodes is interleaved with at least one of the respective one or more electrode strip branches of at least one other of the plurality of touch sensor electrodes such that a total number of pads of the plurality of touch sensor electrodes is at least eight times a total number of crossovers formed by the plurality of touch sensor electrodes.

2. The capacitive touch sensor apparatus of claim 1, wherein each of the respective one or more electrode strip branches comprises a respective first order branch portion extending from a corresponding primary electrode strip.

3. The capacitive touch sensor apparatus of claim 2, wherein, for each said electrode, the respective first order branch portion is substantially orthogonal to the respective primary electrode strip.

4. The capacitive touch sensor apparatus of claim 3, wherein each of the one or more electrode strip branches further comprises one or more second order branch portions extending substantially orthogonally from the respective first order branch portion, and the respective first order branch portion and the one or more second order branch portions of the first set of electrodes do not form any crossovers with the second set of electrodes, and the respective first order branch portion and the one or more second order branch portions of the second set of electrodes do not form any crossovers with the first set of electrodes.

5. The capacitive touch sensor apparatus of claim 4, wherein, for each said electrode strip branch of the one or more electrode strip branches, the respective second order branch portion is parallel with and laterally offset from a corresponding primary electrode strip.

6. The capacitive touch sensor apparatus of claim 2, wherein each of the respective one or more electrode strip branches further comprises one or more second order branch portions extending from the respective first order branch portion.

7. The capacitive touch sensor apparatus of claim 6, wherein each of the respective one or more electrode strip branches further comprises one or more third order branch portions extending from at least one of the one or more second order electrode branch portions.

8. The capacitive touch sensor apparatus of claim 1, wherein primary electrode strips of the first set of electrodes are substantially parallel to each other, and primary electrode strips of the second set of electrodes are substantially parallel to each other and substantially orthogonal to the primary electrode strips of the first set of electrodes.

9. The capacitive touch sensor apparatus of claim 7, wherein:
for each of the first set of electrodes, the respective primary electrode strip and the respective one or more electrode strip branches define a first pattern, and
for each of the second set of electrodes, the respective primary electrode strip and the respective one or more electrode strip branches define a second pattern.

10. The capacitive touch sensor apparatus of claim 1, wherein the at least one of the interleaved electrode strip branches do not crossover each other.

11. The capacitive touch sensor apparatus of claim 1, wherein the pads have variable sizes.

12. The capacitive touch sensor apparatus of claim 11, wherein, for each said touch sensor electrode of the plurality of touch sensor electrodes, the size of each of the pads of the touch sensor electrode of the plurality of touch sensor electrodes is a function of a position of the pad relative to the respective primary electrode strip of the touch sensor electrode of the plurality of touch sensor electrodes.

13. The capacitive touch sensor apparatus of claim 12, wherein, pads of the respective one or more electrode strip branches are smaller than pads of the respective primary electrode strip.

14. A capacitive touch sensor system comprising: a touch sensor controller; a capacitive touch sensor apparatus operatively coupled to the controller, the capacitive touch sensor apparatus comprising a substrate; a plurality of touch sensor electrodes arranged on the substrate, wherein each said touch sensor electrode of the plurality of touch sensor electrodes comprises a respective plurality of interconnected electrode pads arranged as: a respective primary electrode strip; and a respective one or more electrode strip branches extending from the respective primary electrode strip, wherein the plurality of touch sensor electrodes comprises first and second sets of electrodes, and the first set of electrodes form crossovers with the second set of electrodes, and, for the each said touch sensor electrode of the plurality of touch sensor electrodes, the respective one or more electrode strip branches of the said touch sensor electrode of the plurality of touch sensor electrodes is interleaved with at least one of the respective one or more electrode strip branches of at least one other of the plurality of touch sensor electrodes such that a total number of pads of the plurality of touch sensor electrodes is at least eight times a total number of crossovers formed by the plurality of touch sensor electrodes.

15. The capacitive touch sensor system of claim 14, wherein each of the respective one or more electrode strip branches comprises a respective first order branch portion extending from a corresponding primary electrode strip.

16. The capacitive touch sensor system of claim 15, wherein, for each said electrode, the respective first order branch portion is substantially orthogonal to the respective primary electrode strip.

17. The capacitive touch sensor system of claim 16, wherein each of the one or more electrode strip branches further comprises one or more second order branch portions extending substantially orthogonally from the respective first order branch portion, and the respective first order branch portion and the one or more second order branch portions of the first set of electrodes do not form any crossovers with the second set of electrodes, and the respective first order branch portion and the one or more second order branch portions of the second set of electrodes do not form any crossovers with the first set of electrodes.

18. The capacitive touch sensor system of claim 17, wherein, for each said electrode strip branch of the one or more electrode strip branches, the respective second order branch portion is parallel with and laterally offset from a corresponding primary electrode strip.

19. The capacitive touch sensor system of claim 15, wherein each of the respective one or more electrode strip branches further comprises one or more one or more second order branch portions extending from the respective first order branch portion.

20. The capacitive touch sensor system of claim 14, wherein primary electrode strips of the first set of electrodes are substantially parallel to each other, and primary electrode strips of the second set of electrodes are substantially parallel to each other and substantially orthogonal to the primary electrode strips of the first set of electrodes.

21. An electrode array for a capacitive touch sensor, comprising: a plurality of touch sensor electrodes, wherein each said touch sensor electrode of the plurality of touch sensor electrodes comprises a respective plurality of interconnected electrode pads arranged as: a respective primary electrode strip; a respective first order electrode branch extending from the respective primary electrode strip; and one or more respective higher order electrode branches, the one or more respective higher order electrode branches comprising one or more secondary electrode branches extending from the respective first order electrode branch, wherein the plurality of touch sensor electrodes comprises first and second sets of electrodes, and the first set of electrodes form crossovers with the second set of electrodes, and, for the each said touch sensor electrode of the plurality of touch sensor electrodes, one or more electrode strip branches of the said touch sensor electrode of the plurality of touch sensor electrodes is interleaved with at least one of the one or more electrode strip branches of at least one other of the plurality of touch sensor electrodes such that a total number of pads of the plurality of touch sensor electrodes is at least eight times a total number of crossovers formed by the plurality of touch sensor electrodes.

22. The electrode array of claim 21, each respective first order branch portion extends substantially orthogonally from a corresponding primary electrode strip, each second order branch portion extends substantially orthogonally from a corresponding first order branch portion, and wherein the respective first order branch portion and one or more second order branch portions of the first set of electrodes do not form any crossovers with the second set of electrodes, and the respective first order branch portion and the one or more second order branch portions of the second set of electrodes do not form any crossovers with the first set of electrodes.

23. The electrode array of claim 22, wherein, for each said electrode strip branch of the one or more electrode strip branches, the respective second order branch portion is parallel with and laterally offset from a corresponding primary electrode strip.

* * * * *

UNITED STATES PATENT AND TRADEMARK OFFICE
CERTIFICATE OF CORRECTION

PATENT NO. : 11,112,922 B2
APPLICATION NO. : 16/956442
DATED : September 7, 2021
INVENTOR(S) : McCulloch et al.

Page 1 of 1

It is certified that error appears in the above-identified patent and that said Letters Patent is hereby corrected as shown below:

In the Claims

In Claim 9, Column 22, Line 16, delete "claim 7," and insert --claim 8,--.
In Claim 19, Column 23, Line 23, delete "one or more one or more" and insert --one or more--.

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*